(12) United States Patent
Park et al.

(10) Patent No.: US 11,257,896 B2
(45) Date of Patent: *Feb. 22, 2022

(54) DISPLAY DEVICE

(71) Applicant: Samsung Display Co., Ltd., Yongin-si (KR)

(72) Inventors: Hyung Jun Park, Yongin-si (KR); Yang Wan Kim, Yongin-si (KR); Byung Sun Kim, Yongin-si (KR); Su Jin Lee, Yongin-si (KR); Jae Yong Lee, Yongin-si (KR); Ji Hyun Ka, Yongin-si (KR); Tae Hoon Kwon, Yongin-si (KR); Jin Tae Jeong, Yongin-si (KR); Seung Ji Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/859,917

(22) Filed: Apr. 27, 2020

(65) Prior Publication Data
US 2020/0258973 A1 Aug. 13, 2020

Related U.S. Application Data

(63) Continuation of application No. 15/987,675, filed on May 23, 2018, now Pat. No. 10,636,859.

(30) Foreign Application Priority Data

May 23, 2017 (KR) ........................ 10-2017-0063718

(51) Int. Cl.
*H01L 27/32* (2006.01)
*H01L 27/12* (2006.01)
(Continued)

(52) U.S. Cl.
CPC ....... *H01L 27/3276* (2013.01); *G09G 3/3233* (2013.01); *G09G 3/3266* (2013.01);
(Continued)

(58) Field of Classification Search
CPC ............ H01L 27/3276; H01L 27/3262; H01L 27/3258; H01L 27/3248; H01L 27/3246;
(Continued)

(56) References Cited

U.S. PATENT DOCUMENTS 6,774,414 B2  8/2004 Chang
7,253,865 B2  8/2007 Battersby
(Continued)

FOREIGN PATENT DOCUMENTS

CN     1628263 A   6/2005
CN     1656530 A   8/2005
(Continued)

OTHER PUBLICATIONS

Uchida, Yoshihiro et al., "Parasitic Capacitance Modeling for TFT Liquid Crystal Displays," 33rd Conference on European Solid-State Device Research, Oct. 2004, 4 pages.
(Continued)

*Primary Examiner* — Hrayr A Sayadian
(74) *Attorney, Agent, or Firm* — Lewis Roca Rothgerber Christie LLP

(57) ABSTRACT

A display device is disclosed, and the display device includes a substrate including first to third display regions, the second and the third display regions being spaced from each other, each of the second and third display regions having an area smaller than that of the first display region and being continuous to the first display region, first to third pixels in the first to third display regions, first to third lines connected to the first to third pixels, and a dummy part configured to compensate for a difference between a load
(Continued)

value of the first lines and load values of the second and third lines, wherein the second display region includes a first sub-region adjacent to the first display region and a second sub-region spaced from the first display region, and the third display region includes a third sub-region adjacent to the first display region and a fourth sub-region spaced from the first display region.

20 Claims, 14 Drawing Sheets

(51) Int. Cl.
G09G 3/3266 (2016.01)
G09G 3/3233 (2016.01)
G09G 3/3225 (2016.01)
(52) U.S. Cl.
CPC ........ H01L 27/124 (2013.01); H01L 27/1248 (2013.01); H01L 27/1255 (2013.01); H01L 27/3216 (2013.01); H01L 27/3223 (2013.01); H01L 27/3246 (2013.01); H01L 27/3248 (2013.01); H01L 27/3258 (2013.01); H01L 27/3262 (2013.01); H01L 27/3265 (2013.01); G09G 3/3225 (2013.01); G09G 2300/0413 (2013.01); G09G 2300/0426 (2013.01); G09G 2310/0232 (2013.01); G09G 2310/0281 (2013.01); G09G 2320/0223 (2013.01); H01L 27/3211 (2013.01)
(58) Field of Classification Search
CPC ............... H01L 27/3265; H01L 27/124; H01L 27/1248; H01L 27/1255; H01L 27/3223; H01L 27/3216; H01L 27/3211; G09G 3/3266; G09G 3/3233; G09G 2320/0223; G09G 3/3225; G09G 2300/0413; G09G 2310/0232; G09G 2300/0426; G09G 2310/0281
USPC .......................................................... 257/40
See application file for complete search history.

(56) References Cited

U.S. PATENT DOCUMENTS

| | | | |
|---|---|---|---|
| 7,579,624 B2 | 8/2009 | Takasugi et al. | |
| 7,911,423 B2 | 3/2011 | Kim et al. | |
| 8,089,596 B2 | 1/2012 | Koma et al. | |
| 8,325,116 B2 | 12/2012 | Takasugi et al. | |
| 8,350,972 B2 | 1/2013 | Taneda et al. | |
| 8,477,250 B2 | 7/2013 | Schellingerhout et al. | |
| 8,665,249 B2 | 3/2014 | Suh | |
| 8,736,525 B2 | 5/2014 | Kawabe | |
| 9,305,508 B2 | 4/2016 | Park et al. | |
| 9,716,132 B2 | 7/2017 | Kinoshita | |
| 10,115,780 B2 * | 10/2018 | Kim | H01L 27/3262 |
| 10,229,964 B2 * | 3/2019 | Kim | H01L 27/3276 |
| 10,354,578 B2 * | 7/2019 | Ka | G09G 3/3406 |
| 10,403,193 B2 * | 9/2019 | Kim | G09G 3/3233 |
| 10,418,597 B2 | 9/2019 | Li et al. | |
| 10,467,958 B2 | 11/2019 | Kim et al. | |
| 10,490,119 B2 * | 11/2019 | Kim | H01L 29/40 |
| 10,490,122 B2 * | 11/2019 | Kim | H01L 27/3262 |
| 10,504,446 B2 * | 12/2019 | Kim | G09G 3/3258 |
| 10,516,016 B2 * | 12/2019 | Kim | H01L 27/3265 |
| 10,636,859 B2 * | 4/2020 | Park | G09G 3/3266 |
| 10,748,472 B2 * | 8/2020 | Kim | H01L 27/3223 |
| 2003/0030630 A1 | 2/2003 | Bayot et al. | |
| 2004/0012744 A1 | 1/2004 | Ishige et al. | |
| 2004/0125258 A1 | 7/2004 | Moon et al. | |
| 2005/0243259 A1 | 11/2005 | Song et al. | |
| 2006/0244387 A1 | 11/2006 | Park et al. | |
| 2006/0290618 A1 | 12/2006 | Goto | |
| 2007/0080433 A1 | 4/2007 | Lai | |
| 2008/0088568 A1 | 4/2008 | Haga et al. | |
| 2008/0218450 A1 | 9/2008 | Park | |
| 2009/0102758 A1 | 4/2009 | Anzai et al. | |
| 2009/0102824 A1 | 4/2009 | Tanaka et al. | |
| 2009/0295843 A1 | 12/2009 | Dunn | |
| 2009/0303260 A1 | 12/2009 | Takasugi | |
| 2009/0303404 A1 | 12/2009 | Kretz | |
| 2010/0020059 A1 | 1/2010 | Suh | |
| 2010/0039604 A1 | 2/2010 | Kim | |
| 2010/0073335 A1 | 3/2010 | Min et al. | |
| 2010/0177024 A1 | 7/2010 | Choi | |
| 2010/0187533 A1 | 7/2010 | Chang | |
| 2011/0084955 A1 | 4/2011 | Kim | |
| 2012/0112988 A1 | 5/2012 | Nakanishi et al. | |
| 2013/0106817 A1 | 5/2013 | Gang et al. | |
| 2015/0022513 A1 | 1/2015 | Kim | |
| 2015/0069348 A1 | 3/2015 | Tae | |
| 2015/0325593 A1 | 11/2015 | Shih et al. | |
| 2015/0331290 A1 | 11/2015 | Jung et al. | |
| 2015/0379930 A1 | 12/2015 | Lee et al. | |
| 2016/0012768 A1 | 1/2016 | In et al. | |
| 2016/0019856 A1 | 1/2016 | Tanaka et al. | |
| 2016/0027380 A1 | 1/2016 | Kim et al. | |
| 2016/0035811 A1 * | 2/2016 | Choi | H01L 51/5221 257/72 |
| 2016/0086977 A1 | 3/2016 | Go et al. | |
| 2016/0111040 A1 | 4/2016 | Kim et al. | |
| 2016/0190166 A1 | 6/2016 | Kim et al. | |
| 2016/0240141 A1 | 8/2016 | Lee et al. | |
| 2016/0321992 A1 * | 11/2016 | Kim | G09G 3/3225 |
| 2017/0249896 A1 * | 8/2017 | Kim | H01L 27/124 |
| 2017/0301280 A1 * | 10/2017 | Ka | G09G 3/3406 |
| 2018/0005585 A1 * | 1/2018 | Kim | H01L 27/3223 |
| 2018/0075804 A1 | 3/2018 | Kim et al. | |
| 2018/0082630 A1 * | 3/2018 | Kim | G09G 3/3233 |
| 2018/0090061 A1 * | 3/2018 | Kim | H01L 27/3288 |
| 2018/0151660 A1 * | 5/2018 | Kim | H01L 27/3265 |
| 2018/0151663 A1 * | 5/2018 | Kim | H01L 27/3223 |
| 2018/0240856 A1 * | 8/2018 | Kim | H01L 27/3276 |
| 2019/0035876 A1 | 1/2019 | Kim et al. | |

FOREIGN PATENT DOCUMENTS

| | | |
|---|---|---|
| CN | 1836269 A | 9/2006 |
| CN | 101401143 A | 4/2009 |
| CN | 101443695 A | 5/2009 |
| CN | 101561992 A | 10/2009 |
| CN | 101578649 A | 11/2009 |
| CN | 101313349 A | 12/2010 |
| CN | 102396020 A | 3/2012 |
| CN | 102789755 A | 11/2012 |
| CN | 202583659 U | 12/2012 |
| CN | 103579221 A | 2/2014 |
| CN | 104077998 A | 10/2014 |
| CN | 105204248 A | 12/2015 |
| CN | 106711180 A | 5/2017 |
| EP | 1063630 A2 | 12/2000 |
| EP | 2085952 A1 | 8/2009 |
| EP | 3232431 A1 | 10/2017 |
| EP | 3264405 A2 | 1/2018 |
| JP | 2007-232981 A | 9/2007 |
| KR | 10-0672792 B1 | 1/2007 |
| KR | 10-2008-0060886 | 7/2008 |
| KR | 10-2009-0005651 A | 1/2009 |
| KR | 10-1054327 B1 | 8/2011 |
| KR | 10-1064425 | 9/2011 |
| KR | 10-1101070 B1 | 12/2011 |
| KR | 10-1376654 | 3/2014 |
| KR | 10-1416529 | 7/2014 |
| KR | 10-1432126 | 8/2014 |
| KR | 10-2016-0099770 A | 8/2016 |
| KR | 10-2017-0102147 A | 9/2017 |
| KR | 10-2017-0119270 A | 10/2017 |
| KR | 10-2018-0003747 A | 1/2018 |
| KR | 10-2018-0029133 A | 3/2018 |
| KR | 10-2018-0033373 A | 4/2018 |

(56) References Cited

FOREIGN PATENT DOCUMENTS

| KR | 10-2018-0061565 | | 6/2018 |
|---|---|---|---|
| TW | | 201109786 A1 | 3/2011 |
| WO | WO 2007/069187 A2 | | 6/2007 |

OTHER PUBLICATIONS

Zhou, Lei et al., "Design Analysis of Large Size Metal Oxide TFT Panel," Chinese Journal of Luminescence, vol. 36, No. 5, May 2015, 6 pages.
EPO Partial Search Report dated Oct. 25, 2017, for corresponding European Patent Application No. 17178307.9 (31 pages).
Chinese Office Action dated Oct. 9, 2020, issued in Chinese Patent Application No. 201710515778.X (11 pages).
EPO Office action dated Jun. 3, 2019, corresponding to European Patent Application No. 17166354.5 (10 pages).
European Result of consultation on Jul. 13, 2020 issued in European Patent Application No. 17166354.5, which is corresponding to U.S. Pat. No. 10,354,578.
EPO Extended Search Report dated Jun. 27, 2018, for corresponding European Patent Application No. 18157710.7 (7 pages).
U.S. Office Action dated May 17, 2018, issued in U.S. Appl. No. 15/398,391 (16 pages).
U.S. Office Action dated May 17, 2018, issued in U.S. Appl. No. 15/434,196 (15 pages).
U.S. Office Action dated Jan. 11, 2019, issued in U.S. Appl. No. No. 15/712,657 (25 pages).
U.S. Office Action dated Sep. 11, 2020, issued in U.S. Appl. No. 16/723,970 (10 pages).
U.S. Office Action dated Apr. 1, 2020, issued in U.S. Appl. No. 16/805,635 (18 pages).
U.S. Office Action dated May 13, 2021, issued in U.S. Appl. No. 16/995,615 (30 pages).
U.S. Notice of Allowance dated Apr. 14, 2021, issued in U.S. Appl. No. 16/298,924 (13 pages).
EPO Extended European Search Report dated Jun. 14, 2021, issued in European Patent Application No. 21164738.3 (12 pages).
U.S. Notice of Allowance dated Mar. 9, 2021, issued in U.S. Appl. No. 16/805,635(10 pages).

\* cited by examiner

DISPLAY DEVICE

CROSS-REFERENCE TO RELATED APPLICATIONS

This application is a continuation of U.S. patent application Ser. No. 15/987,675, filed May 23, 2018, which claims priority to and the benefit of Korean Patent Application No. 10-2017-0063718, filed May 23, 2017, the entire content of both of which is incorporated herein by reference.

BACKGROUND

1. Field

An aspect of the present disclosure relates to a display device.

2. Description of the Related Art

A display device includes a plurality of pixels each including a display element, lines (e.g., electrical connections), and a plurality of transistors that are connected to the lines and drive the display element, which are formed therein.

The lines may have different load values according to their length, and a difference in luminance may be caused by a difference between the load values in a final image provided by the display device.

SUMMARY

Aspects of embodiments are directed to a display device having uniform luminance regardless of regions.

According to some embodiments of the present disclosure, there is provided a display device including: a substrate including a first display region, a second display region, and a third display region, the second display region and the third display region being spaced from each other, each of the second and third display regions having an area smaller than that of the first display region and being continuous to the first display region; first pixels, second pixels, and third pixels respectively in the first to third display regions; first lines, second lines, and third lines respectively connected to the first to third pixels; and a dummy part configured to compensate for a difference between a load value of the first lines and load values of the second and third lines, wherein the second display region includes a first sub-region adjacent to the first display region and a second sub-region adjacent to the first sub-region, and the third display region includes a third sub-region adjacent to the first display region and a fourth sub-region adjacent to the third sub-region, wherein the dummy part includes: a first dummy part connected to the second lines of the first sub-region and the third lines of the third sub-region and configured to compensate for a first load value; a second dummy part connected to the second lines of the second sub-region and configured to compensate for a second load value; and a third dummy part connected to the third lines of the fourth sub-region and configured to compensate for a third load value.

In some embodiments, the display device further includes line connection parts connecting the second lines of the first sub-region and the third lines of the third sub-region, wherein the line connection parts overlap with the first dummy part.

In some embodiments, the first lines are longer than the second and third lines.

In some embodiments, the substrate further includes a peripheral region, the peripheral region including a first peripheral region adjacent to the first display region, a second peripheral region adjacent to the second display region, a third peripheral region adjacent to the third display region, and an additional peripheral region connecting the second peripheral region and the third peripheral region, and wherein the first dummy part is in the additional peripheral region, the second dummy part is in the second peripheral region corresponding to the second sub-region, and the third dummy part is in the third peripheral region corresponding to the fourth sub-region.

In some embodiments, each of the first pixels, the second pixels, and the third pixels includes at least one transistor connected to a corresponding data line from among data lines and a corresponding one of the first to third lines, a protective layer covering the transistor, and an organic light emitting device connected to the transistor on the protective layer, wherein the transistor includes: an active pattern on the substrate; a source electrode and a drain electrode, each of the source and drain electrodes being connected to the active pattern; a gate electrode on the active pattern with a gate insulating layer interposed therebetween; and an interlayer insulating layer covering the gate electrode, the interlayer insulating layer including a first interlayer insulating layer, a second interlayer insulating layer, and a third interlayer insulating layer that are sequentially stacked, and wherein the organic light emitting device includes: a first electrode connected to the transistor; a pixel defining layer exposing the first electrode therethrough; an emitting layer provide on the first electrode, the emitting layer being exposed by the pixel defining layer; and a second electrode on the emitting layer.

In some embodiments, the display device further includes a power supply line on the second interlayer insulating layer in the peripheral region, the power supply line overlapping with the line connection parts in the additional peripheral region, wherein the line connection part is between the first interlayer insulating layer and the second interlayer insulating layer.

In some embodiments, the first dummy part includes a first parasitic capacitor formed by the line connection parts and the power supply line.

In some embodiments, the first dummy part further includes a first dummy pattern connected to the power supply line through a contact opening, the first dummy pattern being between the substrate and the gate insulating layer.

In some embodiments, in the second peripheral region and the third peripheral region, the second dummy part and the third dummy part include first dummy lines and second dummy lines that overlap with the power supply line and are connected to the second lines and the third lines, and the first dummy lines and the second dummy lines are between the first interlayer insulating layer and the second interlayer insulating layer.

In some embodiments, the second dummy part and the third dummy part include a second parasitic capacitor formed by the first and second dummy lines and the power supply line.

In some embodiments, the second dummy part and the third dummy part further include second dummy pattern and a third dummy pattern that are connected to the power supply line through a dummy contact opening, and are between the substrate and the gate insulating layer.

In some embodiments, the display device further includes: a fourth dummy part connected to the first dummy part and the second dummy part in the second peripheral region; and a fifth dummy part connected to the first dummy part and the third dummy part in the third peripheral region.

In some embodiments, the fourth dummy part and the fifth dummy part include at least one dummy pixel, wherein the at least one dummy pixel includes: at least one dummy transistor connected to a corresponding data line from among the data lines and a corresponding one of the second lines and the third lines; a protective layer on the at least one dummy transistor; a pixel defining layer on the protective layer; and a dummy second electrode on the pixel defining layer, and wherein the dummy second electrode includes the same material as the second electrode.

In some embodiments, the at least one dummy transistor includes: a dummy active pattern on the substrate; a dummy source electrode and a dummy drain electrode, each of the dummy source and dummy drain electrodes being connected to the dummy active pattern; and a dummy gate electrode on the dummy active pattern with a gate insulating layer therebetween, the dummy gate electrode being connected to the first dummy line or the second dummy line.

In some embodiments, the fourth dummy part and the fifth dummy part include a third parasitic capacitor including a first third parasitic capacitor formed by one of the second lines and the third lines and the dummy active pattern, and a second third parasitic capacitor formed by one of the second lines and the third lines and the data line.

In some embodiments, the at least one dummy pixel of the fourth dummy part is connected to the second lines and the first dummy line, and the at least one dummy pixel of the fifth dummy part is connected to the third lines and the second dummy line.

In some embodiments, the first lines are first scan lines that provide first scan signals to the first pixels, the second lines are second scan lines that provide second scan signals to the second pixels, and the third lines are third scan lines that provide third scan signals to the third pixels.

In some embodiments, the first lines are first emission control line that provide first emission control signals to the first pixels, the second lines are second emission control lines that provide second emission control signals to the second pixels, and the third lines are third emission control lines that provide third emission control signals to the third pixels.

In some embodiments, each of the second sub-region and the fourth sub-region has a shape with a decreasing width further away from the first display region.

According to some embodiments of the present disclosure, there is provided a display device including: a substrate including a first display region, a second display region, and a third display region, the second display region and the third display region being spaced from each other, each of the second and third display regions having an area smaller than that of the first display region and being connected to the first display region; first pixels, second pixels, and third pixels respectively in the first to third display regions; first lines, second lines, and third lines respectively connected to the first to third pixels; and a dummy part configured to compensate for a difference between a load value of the first lines and load values of the second and third lines, wherein the second display region includes a first sub-region adjacent to the first display region and a second sub-region adjacent to the first sub-region, and the third display region includes a third sub-region adjacent to the first display region and a fourth sub-region adjacent to the third sub-region, wherein the dummy part includes: a first dummy part connected to the second lines of the first sub-region and the third lines of the third sub-region and configured to compensate for a first load value; a second dummy part connected to the second lines of the second sub-region and configured to compensate for a second load value; a third dummy part connected to the third lines of the fourth sub-region and configured to compensate for a third load value; a fourth dummy part connected to the first dummy part and the second dummy part; and a fifth dummy part connected to the first dummy part and the third dummy part.

In some embodiments, the first lines are longer than the second lines and the third lines.

In some embodiments, the substrate further includes a peripheral region, the peripheral region including a first peripheral region adjacent to the first display region, a second peripheral region adjacent to the second display region, a third peripheral region adjacent to the third display region, and an additional peripheral region connecting the second peripheral region and the third peripheral region, and wherein the first dummy part is in the additional peripheral region, the second dummy part is in the second peripheral region corresponding to the second sub-region, the third dummy part is in the third peripheral region corresponding to the fourth sub-region, the fourth dummy part is in the second peripheral region, and the fifth dummy part is in the third peripheral region.

In some embodiments, each of the first pixels, the second pixels, and the third pixels includes at least one transistor connected to a data line and one of the first to third lines, a protective layer covering the transistor, and an organic light emitting device connected to the transistor on the protective layer, wherein the transistor includes: an active pattern on the substrate; a source electrode and a drain electrode, each of the source and drain electrodes being connected to the active pattern; a gate electrode on the active pattern with a gate insulating layer interposed therebetween; and an interlayer insulating layer covering the gate electrode, the interlayer insulating layer including a first interlayer insulating layer, a second interlayer insulating layer, and a third interlayer insulating layer that are sequentially stacked, and wherein the organic light emitting device includes: a first electrode connected to the transistor; a pixel defining layer exposing the first electrode therethrough; an emitting layer provide on the first electrode, the emitting layer being exposed by the pixel defining layer; and a second electrode on the emitting layer.

In some embodiments, the display device further includes: line connection parts connecting the second lines of the first sub-region and the third lines of the third sub-region in the additional peripheral region; and a power supply line on the second interlayer insulating layer in the peripheral region, the power supply line overlapping the line connection parts in the additional peripheral region, wherein the line connection part is between the first interlayer insulating layer and the second interlayer insulating layer, and the line connection parts overlap with the power supply line.

In some embodiments, the first dummy part includes a first parasitic capacitor formed by the line connection parts and the power supply line.

In some embodiments, the first dummy part further includes a first dummy pattern connected to the power supply line through a contact opening, the first dummy pattern being between the substrate and the gate insulating layer.

In some embodiments, in the second peripheral region and the third peripheral region, the second dummy part and the third dummy part include first dummy lines and second dummy lines that overlap with the power supply line and are connected to the second lines and the third lines, and the first dummy lines and the second dummy lines are between the first interlayer insulating layer and the second interlayer insulating layer.

In some embodiments, the second dummy part and the third dummy part include a second parasitic capacitor formed by the first and second dummy lines and the power supply line.

In some embodiments, the second dummy part and the third dummy part further include second dummy pattern and a third dummy pattern that are connected to the power supply line through a dummy contact opening, and are between the substrate and the gate insulating layer.

In some embodiments, the fourth dummy part and the fifth dummy part include at least one dummy pixel, wherein the at least one dummy pixel includes: at least one dummy transistor; a protective layer on the at least one dummy transistor; a pixel defining layer on the protective layer; and a dummy second electrode on the pixel defining layer, and wherein the dummy second electrode includes the same material as the second electrode.

In some embodiments, the at least one dummy transistor includes: a dummy active pattern on the substrate; a dummy source electrode and a dummy drain electrode, each of the dummy source and dummy drain electrodes being connected to the dummy active pattern; and a dummy gate electrode on the dummy active pattern with a gate insulating layer therebetween, the dummy gate electrode being connected to a dummy line.

In some embodiments, the fourth dummy part and the fifth dummy part include a third parasitic capacitor including a first third parasitic capacitor formed by one of the second lines and the third lines and the dummy active pattern, and a second third parasitic capacitor formed by one of the second lines and the third lines and the data line.

In some embodiments, the at least one dummy pixel of the fourth dummy part is connected to the second lines and a first dummy line, and the at least one dummy pixel of the fifth dummy part is connected to the third lines and a second dummy line.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the figures, dimensions may be exaggerated for clarity of illustration. Like reference numerals refer to like elements throughout.

DETAILED DESCRIPTION

Hereinafter, exemplary embodiments of the present disclosure will be described in detail with reference to the accompanying drawings.

Figure 1:
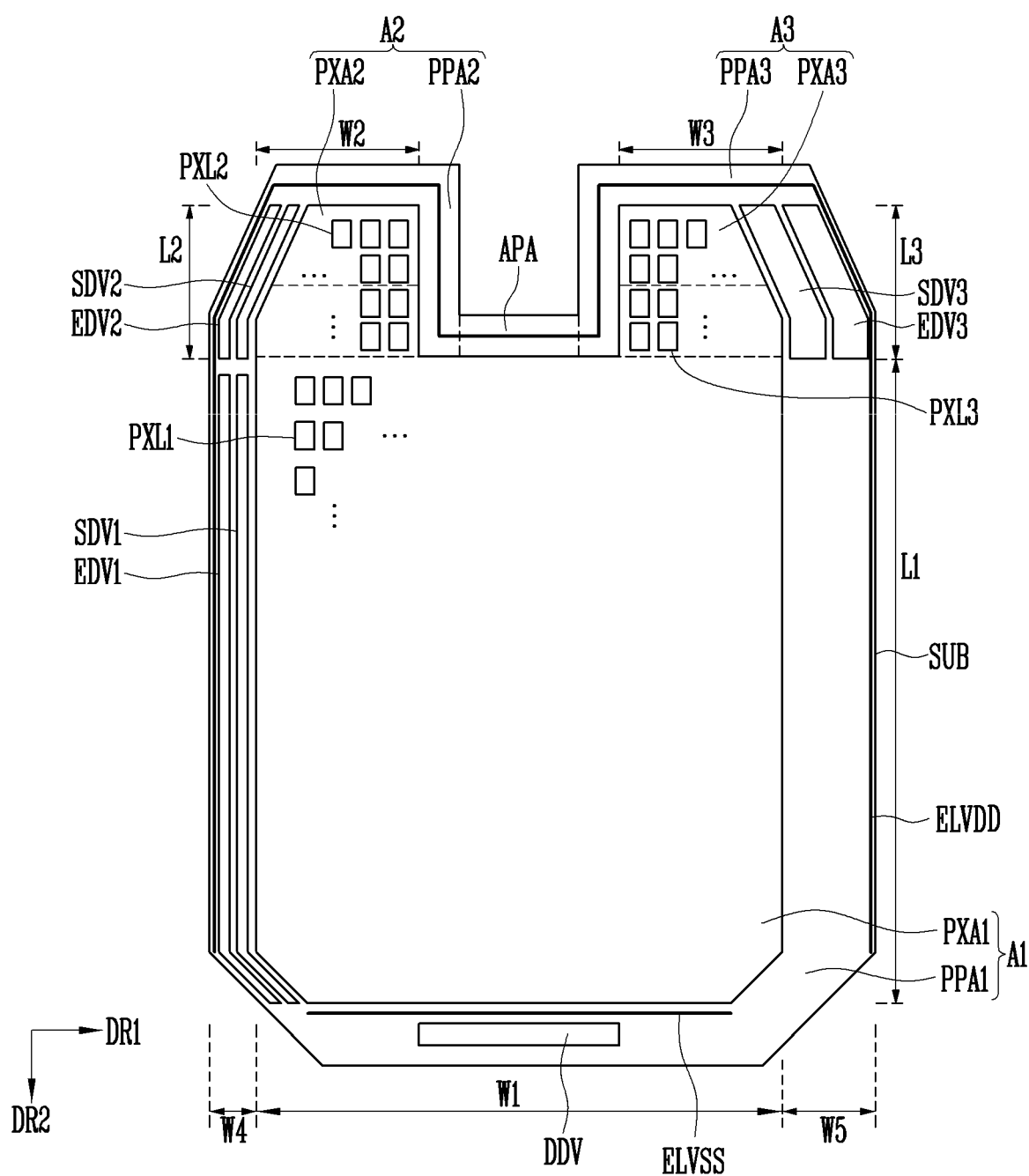
FIG. 1 is a plan view illustrating a display device according to an embodiment of the present disclosure.
Figure 2:
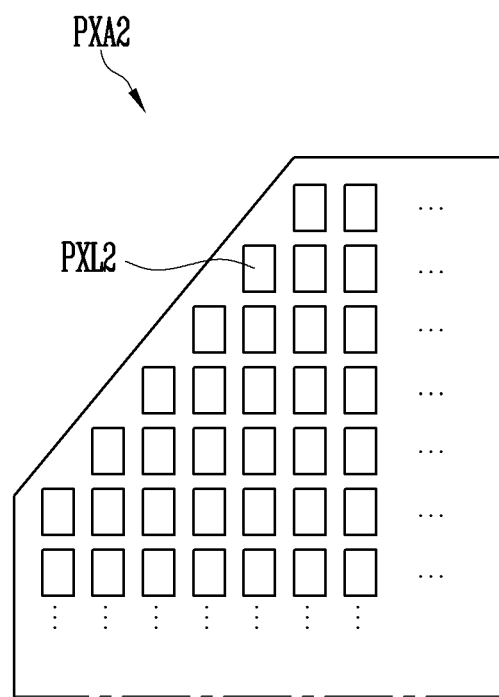
FIG. 2 is an enlarged view of a second display region of FIG. 1.

FIG. 1 is a plan view illustrating a display device according to an embodiment of the present disclosure. FIG. 2 is an enlarged view of a second display region of FIG. 1.

Referring to FIGS. 1 and 2, the display device according to the embodiment of the present disclosure may include a substrate SUB, pixels PXL1, PXL2, and PXL3 (hereinafter, referred to as PXL) provided on the substrate SUB, a driving unit (e.g., a driver) that is provided on the substrate SUB and drives the pixels PXL, a power supply unit (or power supply) that supplies power to the pixels PXL, and a line unit (an electrical connection unit) that connects the pixels PXL to the driving unit.

The substrate SUB may include a plurality of regions, and at least two of the regions may have different areas. In an example, the substrate SUB may have two regions, and the two regions may have areas different from each other. Also, in an example, the substrate SUB may have three regions. In this case, the three regions may have areas different from one another, or only two regions from among the three regions may have areas different from each other. In an example, the substrate SUB may have four or more regions.

In the following embodiment, for convenience of description, a case where the substrate SUB includes three regions, that is, first to third regions A1, A2, and A3 is illustrated as an example.

Each of the first to third regions A1, A2, and A3 may have various suitable shapes. For example, each of the first to third regions A1, A2, and A3 may have a closed polygonal shape including linear (e.g., straight) sides. Each of the first to third regions A1, A2, and A3 may have shapes such as a circle and an ellipse, which include curved sides. Each of the first to third regions A1, A2, and A3 may have shapes such as a semicircle and a semi-ellipse, which include linear and curved sides.

In an embodiment of the present disclosure, when each of the first to third regions A1, A2, and A3 has linear sides, at least some of corners of each of the shapes may be formed in a curve. For example, when each of the first to third regions A1, A2, and A3 has a rectangular shape, a portion at which adjacent linear sides meet each other may be replaced with a curve having a set or predetermined curvature. That is, a vertex portion of the rectangular shape may be formed with a curved side having both adjacent ends respectively connected to two adjacent linear sides, the curved side having a set or predetermined curvature. The curvature may be differently set depending on positions. For example, the curvature may be changed depending on a position at which the curve is started, a length of the curve, and/or the like.

In an embodiment of the present disclosure, each of the first to third regions A1, A2, and A3 may have an approximately quadrangular shape in which a region adjacent to at least one vertex from among the vertexes of the quadrangular shape is removed. The removed region adjacent to at least one vertex from among the vertexes of the quadrangular shape may be one of a triangular shape and a quadrangular shape. For example, as shown in FIG. 1, a side corresponding to the removed region of each of the first to third regions A1, A2, and A3 may have an oblique line shape inclined (or sloped) with respect to one side of the quadrangular shape.

The first to third regions A1, A2, and A3 may have display regions PXA1, PXA2, and PXA3 (hereinafter, referred to as PXA) and peripheral regions PPA1, PPA2, and PPA3 (hereinafter, referred to as PPA). The display regions PXA are regions provided with the pixels PXL that display an image. Each pixel PXL will be described later.

In an embodiment of the present disclosure, the first to third display regions PXA1, PXA2, and PXA3 may roughly have shapes corresponding to those of the first to third regions A1, A2, and A3, respectively.

The peripheral regions PPA may be regions in which the pixels PXL are not provided, and no image is displayed in the peripheral regions PPA. The peripheral regions PPA may be provided with the driving unit for driving the pixels PXL, the power supply unit for supplying power to the pixels PXL, and some of lines that connect the pixels PXL to the driving unit. The peripheral regions PPA correspond to a bezel in a final display device, and widths of the bezel may be determined based on those of the peripheral regions.

Each of the first to third regions A1, A2, and A3 will be described as follows.

The first region A1 may have the largest area from among the first to third regions A1, A2, and A3. The first region A1 may include a first display region PXA1 in which an image is displayed, and a first peripheral region PPA1 surrounding at least one portion of the first display region PXA1.

The first display region PXA1 may be provided in a shape corresponding to that of the first region A1. In an embodiment of the present disclosure, the first display region PXA1 may have a first width W1 in a first direction DR1, and have a first length L1 in a second direction DR2 intersecting the first direction DR1.

The first peripheral region PPA1 may be provided at at least one side of the first display region PXA1. In an embodiment of the present disclosure, the first peripheral region PPA1 surrounds the circumference of the first display region PXA1, and may be provided at a portion where the second region A2 and the third region A3, which will be described later, are not disposed. In an embodiment of the present disclosure, the first peripheral region PPA1 may include a lateral part extending in the first direction DR1 and a longitudinal part extending in the second direction DR2. The longitudinal part of the first peripheral region PPA1 may be provided in a pair to be spaced apart from each other along the width direction of the first display region PXA1.

The second region A2 may have an area smaller than that of the first region A1. The second region A2 may include a second display region PXA2 in which an image displayed and a second peripheral region PPA2 surrounding at least one portion of the second display region PXA2.

The second display region PXA2 may be provided in a shape corresponding to that of the second region A2. In an embodiment of the present disclosure, the second display region PXA2 may have a second width W2 smaller than a first width W1 of the first display region PXA1. The second display region PXA2 may have a second length L2 smaller than the first length L1 of the first display region PXA1. The second display region PXA2 is provided in a shape protruding from the first display region PXA1, and may be directly connected to the first display region PXA1. In other words, an edge portion of the second display region PXA2, which is closest to the first display region PXA1, may correspond to an edge of the first display region PXA1.

The second peripheral region PPA2 may be provided at at least one side of the second display region PXA2. In an embodiment of the present disclosure, the second peripheral region PPA2 surrounds the second display region PXA2, but may not be provided at a portion at which the first display region PXA1 and the second display region PXA2 are connected to each other. In an embodiment of the present disclosure, the second peripheral region PPA2 may also include a lateral part extending in the first direction DR1 and a longitudinal part extending in the second direction DR2. The longitudinal part of the second peripheral region PPA2 may be provided in a pair to be spaced apart from each other along the width direction of the second display region PXA2.

The third region A3 may have an area smaller than that of the first region A1. The third region A3 may have the same area as the second region A2. In some examples, the third region A3 may have an area different from that of the second region A2. The third region A3 may include a third display region PXA3 in which an image is displayed, and a third peripheral region PPA3 surrounding at least a portion of the third display region PXA3.

The third display region PXA3 may be provided in a shape corresponding to that of the third region A3. In an embodiment of the present disclosure, the third display region PXA3 may have a third width W3 smaller than the first width W1 of the first display region PXA1. The third display region PXA3 may have a third length L3 smaller than the first length L1 of the first display region PXA1. The second width W2 and the third width W3 may be equal to or different from each other. In addition, the second length L2 and the third length L3 may be equal to or different from each other.

The third display region PXA3 is provided in a shape protruding from the first display region PXA1, and may be directly connected to the first display region PXA1. In other words, an edge portion of the first display region PXA1, which is closest to the third display region PXA3, may correspond to an edge of the first display region PXA1.

The third peripheral region PPA3 may be provided at at least one side of the third display region PXA3. In an embodiment of the present disclosure, the third peripheral region PPA3 surrounds the third display region PXA3, but may not be provided at a portion at which the first display region PXA1 and the third display region PXA3 are connected to each other. In an embodiment of the present disclosure, the third peripheral region PPA3 may also include a lateral part extending in the first direction DR1 and a longitudinal part extending in the second direction DR2. The longitudinal part of the third peripheral region PPA3 may be provided in a pair to be spaced apart from each other along the width direction of the first display region PXA1.

In an embodiment of the present disclosure, the third region A3 may have a shape linearly symmetric to the second region A2 with respect to a center line of the first region A1. In this case, an arrangement relationship of components provided in the third region A3 may be substantially identical to that of components provided in the second region A2 except some lines.

Therefore, the substrate SUB may have a shape in which the second region A2 and the third region A3 protrude from the first region A1 in the second direction DR2. In addition, because the second region A2 and the third region A3 are disposed to be spaced apart from each other, the substrate SUB may have a shape that is depressed between the second region A2 and the third region A3. That is, the substrate SUB may have a notch provided between the second region A2 and the third region A3.

In an embodiment of the present disclosure, the longitudinal parts of the first peripheral region PPA1 may be respectively connected to some of the longitudinal parts of the second peripheral region PPA2 and the third peripheral region PPA3. For example, a left longitudinal part of the first peripheral region PPA1 may be connected to a left longitudinal part of the second peripheral region PPA2. A right longitudinal part of the first peripheral region PPA1 may be connected to a right longitudinal part of the third peripheral region PPA3. In addition, the left longitudinal part of the first peripheral region PPA1 and the left longitudinal part of the second peripheral region PPA2 may have the same width W4. The right longitudinal part of the first peripheral region PPA1 and the right longitudinal part of the third peripheral region PPA3 may have the same width W5.

The width W4 of the left longitudinal parts of the first peripheral region PPA1 and the second peripheral region PPA2 may be equal to or different from the width W5 of the right longitudinal parts of the first peripheral region PPA1 and the third peripheral region PPA3. For example, the width W4 of the left longitudinal parts of the first peripheral region PPA1 and the second peripheral region PPA2 may be smaller than the width W5 of the right longitudinal parts of the first peripheral region PPA1 and the third peripheral region PPA3.

In an embodiment of the present disclosure, the second peripheral region PPA2 and the third peripheral region PPA3 may be connected to each other through an additional peripheral region APA. For example, the additional peripheral region APA may connect the right longitudinal part of the second peripheral region PPA2 to the left longitudinal part of the third peripheral region PPA3. That is, the additional peripheral region APA may be provided at a side of the first display region PXA1 between the second region A2 and the third region A3.

The pixels PXL may be provided in the display regions PXA, that is, the first to third display regions PXA1, PXA2, and PXA3, on the substrate SUB. Each pixel PXL is a minimum unit for displaying an image, and may be provided in plurality. Each pixel PXL may include a display element that emits light. For example, the display element may be any one of a liquid crystal display (LCD) element, an electrophoretic display (EPD) element, an electrowetting display (EWD) element, and an organic light emitting display (OLED) element. In the following embodiment, a case where the display element is an OLED element is illustrated below as an example for convenience of description.

Each pixel PXL may emit light of one of red, green, and blue, but the present disclosure is not limited thereto. For example, each pixel PXL may emit light of a color such as cyan, magenta, yellow, white, or the like.

The pixels PXL may include first pixels PXL1 arranged in the first display region PXA1, second pixels PXL2 arranged in the second display region PXA2, and third pixels PXL3 arranged in the third display region PXA3. In an embodiment of the present disclosure, each of the first to third pixels PXL1, PXL2, and PXL3 may be provided in plurality to be arranged in a matrix form along rows extending in the first direction DR1 and columns extending in the second direction DR2. However, the arrangement form of the first to third pixels PXL1, PXL2, and PXL3 is not particularly limited, and the first to third pixels PXL1, PXL2, and PXL3 may be arranged in various suitable forms. For example, the first pixels PXL1 may be arranged such that the first direction DR1 becomes the row direction, but the second pixel PXL2 may be arranged such that a direction different from the first direction DR1, for example, a direction oblique to the first direction DR1 becomes the row direction. In addition, it will be apparent that the third pixels PXL3 may be arranged in a direction identical to or different from that of the first pixels PXL1 and/or the second pixels PXL2. In another embodiment of the present disclosure, the row direction may become the second direction DR2 and the column direction may become the first direction DR1.

In the second region A2 and the third region A3, the number of second pixels PXL2 and third pixels PXL3 may be changed depending on rows. For example, in the second region A2 and the third region A3, the number of second pixels PXL2 and third pixels PXL3, which are disposed on a row corresponding to a corner configured as a diagonal side having the inclination (e.g., the slope) may be smaller than that of second pixels PXL2 and third pixels PXL3, which are disposed on a row corresponding to a corner configured as a linear side. In addition, the number of second pixels PXL2 and third pixels PXL3, which are disposed on the row, may decrease as the length of the row becomes shorter. Therefore, lengths of lines connecting the second pixels PXL2 and the third pixels PXL3 may be shortened.

In addition, in the second region A2 and the third region A3, scan lines or emission control lines of second pixels PXL2 and third pixels PXL3, which correspond to the same row, may be electrically connected to each other through a scan line connection part or an emission control line connection part.

The driving unit provides signals to each pixel PXL through the line unit, and accordingly, driving of each pixel PXL can be controlled. In FIG. 1, the line unit is omitted in for convenience of description. The line unit will be described later.

The drive unit may include scan drivers SDV1, SDV2, and SDV3 (hereinafter, referred to as SDV) that provide a scan signal to each pixel PXL along a scan line, emission drivers EDV1, EDV2, and EDV3 (hereinafter, referred to as EDV) that provide an emission control signal to each pixel PXL along a emission control line, a data driver DDV that provides a data signal to each pixel PXL along a data line, and a timing controller. The timing controller may control the scan drivers SDV, the emission drivers EDV, and the data driver DDV.

In an embodiment of the present disclosure, the scan drivers SDV may include a first scan driver SDV1 connected to the first pixels PXL1, a second scan driver SDV2 connected to the second pixels PXL2, and a third scan driver SDV3 connected to the third pixels PXL3. In an embodiment of the present disclosure, the emission drivers EDV may include a first emission driver EDV1 connected to the first pixels PXL1, a second emission driver EDV2 connected to the second pixels PXL2, and a third emission driver EDV3 connected to the third pixels PXL3.

The first scan driver SDV1 may be disposed at the longitudinal part in the first peripheral region PPA1. Because the longitudinal part of the first peripheral region PPA1 is provided in pair to be spaced apart from each other along the width direction of the first display region PXA1, the first scan driver SDV1 may be disposed at at least one of the longitudinal parts of the first peripheral region PPA1. The first scan driver SDV1 may extend long along the length direction of the first peripheral region PPA1.

In a similar manner, the second scan driver SDV2 may be disposed in the second peripheral region PPA2, and the third scan driver SDV3 may be disposed in the third peripheral region PPA3.

In an embodiment of the present disclosure, the scan drivers SDV may be directly mounted on the substrate SUB. When the scan drivers SDV are directly mounted on the substrate SUB, the scan drivers SDV may be formed together with the pixels PXL in a process of forming the pixels PXL. However, the mounting positions and forming method of the scan drivers SDV are not limited thereto. For example, the scan drivers SDV may be formed on a separate chip to be provided in a chip on glass form on the substrate SUB. In some examples, the scan drivers SDV may be mounted on a printed circuit board to be connected to the substrate SUB through a connection member.

Similar to the first scan driver SDV1, the first emission driver EDV1 may be disposed at the longitudinal part of the first peripheral region PPA1. The first emission driver EDV1 may be disposed at at least one of the longitudinal parts of the first peripheral region PPA1. The first emission driver EDV1 may extend long along the length direction of the first peripheral region PPA1.

In a similar manner, the second emission driver EDV2 may be disposed in the second peripheral region PPA2, and the third emission driver EDV3 may be disposed in the third peripheral region PPA3.

In an embodiment of the present disclosure, the emission drivers EDV may be directly mounted on the substrate SUB. When the emission drivers EDV are directly mounted on the substrate SUB, the emission drivers EDV may be formed together with the pixels PXL in a process of forming the pixels PXL. However, the mounting positions and forming method of the emission drivers EDV are not limited thereto. For example, the emission drivers EDV may be formed on a separate chip to be provided in a chip on glass form on the substrate SUB. In some examples, the emission drivers EDV may be mounted on a printed circuit board to be connected to the substrate SUB through a connection member.

In an embodiment of the present disclosure, a case where the scan drivers SDV and the emission drivers EDV are adjacent to each other and are formed at any one of the longitudinal part pairs of the peripheral regions PPA is illustrated as an example, but the present disclosure is not limited thereto. The arrangement of the scan drivers SDV and the emission drivers EDV may be changed in various suitable manners. For example, the first scan driver SDV1 may be provided at one of the longitudinal parts of the first peripheral region PPA1, and the first emission diver EDV1 may be provided at the other of the longitudinal parts of the first peripheral region PPA1. In some examples, the first scan driver SDV1 may be provided at both of the longitudinal parts of the first peripheral region PPA1, and the first emission driver EDV1 may be provided at only one of the longitudinal parts of the first peripheral region PPA1.

The data driver DDV may be disposed in the first peripheral region PPA1. Particularly, the data driver DDV may be disposed at the lateral part of the first peripheral region PPA1. The data driver DDV may extend long along the width direction of the first peripheral region PPA1.

In an embodiment of the present disclosure, the positions of the scan drivers SDV, the emission drivers EDV, and/or the data driver DDV may be changed, if desired.

The timing controller may be connected, in various suitable manners, to the first to third scan drivers SDV1, SDV2, and SDV3, the first to third emission drivers EDV1, EDV2, and EDV3, and the data driver DDV through lines. The position at which the timing controller is disposed is not particularly limited. For example, the timing controller may be mounted on a printed circuit board to be connected to the first to third scan drivers SDV1, SDV2, and SDV3, the first to third emission drivers EDV1, EDV2, and EDV3, and the data driver DDV through a flexible printed circuit board. The printed circuit board may be disposed at various suitable positions such as one side of the substrate SUB and a back surface of the substrate SUB.

In addition, in a configuration in which the scan lines or emission control lines of the second pixels PXL2 and the third pixels PXL3, which correspond to the same row, are electrically connected to each other through the scan line connection part or the emission control line connection part, one of the second and third scan drivers SDV2 and SDV3 and one of the second and third emission drivers EDV2 and EDV3 may be omitted.

The power supply unit may include at least one power supply line ELVDD and ELVSS. For example, the power supply unit may include a first power supply line ELVDD and a second power supply line ELVSS (which may also be referred to as first power source ELVDD and second power source ELVSS hereinafter, respectively). The first power supply line ELVDD and the second power supply line ELVSS may supply power to the first pixels PXL1, the second pixels PXL2, and the third pixels PXL3.

One of the first power supply line ELVDD and the second power supply line ELVSS, for example, the first power supply line ELVDD may be disposed to surround the first display region PXA1, the second display region PXA2, and the third display region PXA3 except the region in which the data driver DDV is disposed in the first peripheral region PPA1. For example, the first power supply line ELVDD may have a shape extending along the left longitudinal part of the first peripheral region PPA1, the second peripheral region PPA2, the additional peripheral region APA, the third peripheral region PPA3, and the right longitudinal part of the first peripheral region PPA1.

The other of the first power supply line ELVDD and the second power supply line ELVSS, for example, the second power supply line ELVSS may be disposed to correspond to one side of the first display region PXA1. For example, the second power supply line ELVSS may be disposed in the region in which the data drive DDV is disposed in the first peripheral region PPA1. Also, the second power supply line ELVSS may extend in the width direction of the first display region PXA1.

In the above, a case where the second power supply line ELVSS is disposed to correspond to one side of the first display region PXA1 in the first peripheral region PPA1 and the first power supply line ELVDD is disposed in the other peripheral regions PPA is described as an example, but the present disclosure is not limited thereto. For example, the first power supply line ELVDD and the second power supply line ELVSS may be disposed to surround the first display region PXA1, the second display region PXA2, and third display region PXA3.

A voltage applied to the first power supply line ELVDD may be higher than that applied to the second power supply line ELVSS.

Figure 3:
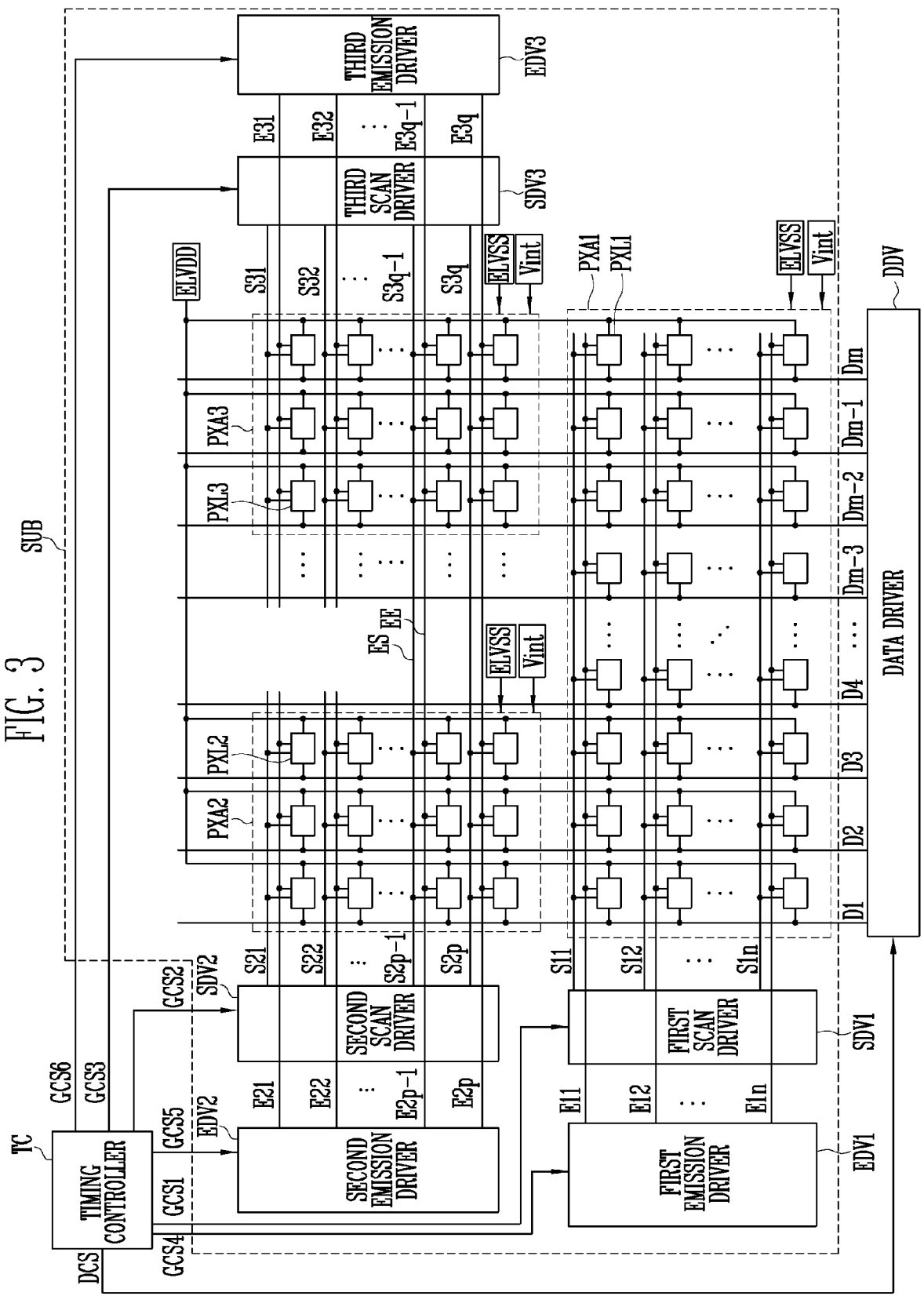
FIG. 3 is a block diagram illustrating an embodiment of pixels and a driving unit according to the embodiment of the present disclosure.

FIG. 3 is a block diagram illustrating an embodiment of the pixels and the driving unit according to the embodiment of the present disclosure.

Referring to FIGS. 1 to 3, the display device according to the present disclosure may include pixels PXL, a driving unit, and a line unit.

The pixels PXL may include first to third pixels PXL1, PXL2, and PXL3, and the driving unit may include first to third scan drivers SDV1, SDV2, and SDV3, first to third emission drivers EDV1, EDV2, and EDV3, a data driver DDV, and a timing controller TC. In FIG. 3, positions of the first to third scan drivers SDV1, SDV2, and SDV3, the first to third emission drivers EDV1, EDV2, and EDV3, the data driver DDV, and the timing controller TC are set for convenience of description. When an actual display device is implemented, the first to third scan drivers SDV1, SDV2, and SDV3, the first to third emission drivers EDV1, EDV2, and EDV3, the data driver DDV, and the timing controller TC may be disposed at other positions in the display device. For example, the data driver DDV is disposed in a region closer to a first region A1 than a second region A2 and a third region A3, but the present disclosure is not limited thereto. For example, the data driver DDV may be disposed adjacent to the second region A2 and the third region A3.

The line unit provides signals of the driving unit to each pixel PXL, and may include scan lines, scan line connection parts ES and emission control line connection parts EE, emission control lines, a power line, and an initialization power line.

The scan lines may include first to third scan lines S11 to S1n, S21 to S2p, and S31 to S3q respectively connected to the first to third pixels PXL1, PXL2, and PXL3. The emission control lines may include first to third emission control lines E11 to E1n, E21 to E2p, and E31 to E3q respectively connected to the first to third pixels PXL1, PXL2, and PXL3. The data lines D1 to Dm and the power line may be connected to the first to third pixels PXL1, PXL2, and PXL3.

Additionally, some of the second scan lines S21 to S2p and the third scan lines S31 to S3q may be electrically connected to each other by scan line connection parts ES. For example, a (p−1)th second scan line S2p−1 may be electrically connected to a (q−1)th third scan line S3q−1 by a (p−1)th scan line connection part ES. In addition, a pth second scan line S2p may be electrically connected to a qth third scan line S3q by a pth scan line connection part ES.

In addition, some of the second emission control lines E21 to E2p and the third emission control lines E31 to E3q may be electrically connected to each other by emission control line connection parts EE. For example, a (p−1)th second emission control line E2p−1 may be electrically connected to a (q−1)th third emission control line E3q−1 by a (p−1)th emission control line connection part EE. In addition, a pth second emission control line E2p may be electrically connected to a qth third emission control line E3q by a pth emission control line connection part EE.

The first pixels PXL1 is located in a first display region PXA1. The first pixels PXL1 may be connected to the first scan lines S11 to S1n, the first emission control lines E11 to E1n, and the data lines D1 to Dm. The first pixels PXL1 may be supplied with a data signal from the data lines D1 to Dm when a scan signal is supplied from the first scan lines S11 to S1n. Each of the first pixels PXL1 supplied with the data signal may control the amount of current flowing from a first power source ELVDD to a second power source ELVSS via an organic light emitting device (for example, an organic light emitting diode OLED described hereinafter).

The second pixels PXL2 may be located in a second display region PXA2. The second pixels PXL2 may be connected to the second scan lines S21 to S2p, the second emission control lines E21 to E2p, and the data lines D1 to D3. The second pixels PXL2 may be supplied with a data signal from the data lines D1 to D3 when a scan signal is supplied from the second scan lines S21 to S2p. Each of the second pixel PXL2 supplied with the data signal may control the amount of current flowing from the first power source ELVDD to the second power source ELVSS via the organic light emitting device.

Additionally, in FIG. 3, it is illustrated that twelve second pixels PXL2 are located in the second display region PXA2 by four second scan lines S21 to S2p, four second emission control lines E21 to E2p, and three data lines D1 to D3, but the present disclosure is not limited thereto. That is, a plurality of second pixels PXL2 may be disposed corresponding to the size of the second display region PXA2, and numbers of second scan lines S21 to S2p, second emission control lines E21 to E2p, and data lines may be variously set in any suitable manner corresponding to the second pixels PXL2.

The third pixels PXL3 may be located in a third display region PXA3 defined by the third scan lines S31 to S3q, the third emission control lines E31 to E3q, and the data lines Dm-2 to Dm. The third pixels PXL3 may be supplied with a data signal from the data lines Dm-2 to Dm when a scan signal is supplied from the third scan lines S31 to S3q. Each of the third pixels PXL3 supplied with the data signal may control the amount of current flowing from the first power source ELVDD to the second power source ELVSS via the organic light emitting device.

Additionally, in FIG. 3, it is illustrated that twelve third pixels PXL3 are located in the third display region PXA3 by four third scan lines S31 to S3q, four third emission control lines E31 to E3q, and three data lines Dm-2 to Dm, but the present disclosure is not limited thereto. That is, the a plurality of third pixels PXL3 may be disposed corresponding to the size of the third display region PXA3, and numbers of third scan lines S31 to S3q, third emission control lines E31 to E3q, and data lines may be variously set in any suitable manner corresponding to the third pixels PXL3.

The first scan driver SDV1 may supply a scan signal to the first scan lines S11 to S1n in response to a first gate control signal GCS1 from the timing controller TC. For example, the first scan driver SDV1 may sequentially supply the scan signal to the first scan lines S11 to S1n. When the scan signal is sequentially supplied to the first scan lines S11 to S1n, the first pixels PXL1 may be sequentially selected in units of horizontal lines.

The second scan driver SDV2 may supply a scan signal to the second scan lines S21 to S2p in response to a second gate control signal GCS2 from the timing controller TC. Here, the scan signal supplied to second scan lines S2p connected to the scan line connection parts ES from among the second scan lines S21 to S2p may be supplied to third scan lines S3q via the scan line connection parts ES. The second scan driver SDV2 may sequentially supply the scan signal to the second scan lines S21 to S2p. When the scan signal is sequentially supplied to the second scan lines S21 to S2p, the second pixels PXL2 may be sequentially selected in units of horizontal lines.

The third scan driver SDV3 may supply a scan signal to the third scan lines S31 to S3q in response to a third gate control signal GCS3 from the timing controller TC. Here, the scan signal supplied to third scan lines S3q connected to the scan line connection parts ES from among the third scan lines S31 to S3q may be supplied to second scan lines S2p via the scan line connection parts ES. The third scan driver SDV3 may sequentially supply the scan signal to the third scan lines S31 to S3q. When the scan signal is sequentially supplied to the third scan lines S31 to S3q, the third pixels PXL3 may be sequentially selected in units of horizontal lines.

Because some of the second scan lines S21 to S2p and some of the third scan lines S31 to S3q are electrically connected to each other by the scan line connection parts ES, the scan signal of the second scan driver SDV2 and the scan signal of the third scan driver SDV3, which are respectively supplied to the second and third scan lines S2p and S3q connected to the scan line connection parts ES, may be supplied to be synchronized with each other. For example, the scan signal supplied from the second scan driver SDV2 to the pth second scan line S2p may be simultaneously supplied with the scan signal supplied from the third scan driver SDV3 to the qth third scan line S3q.

As described above, when the scan signal is supplied to the second and third scan lines S2p and S3q connected to the scan line connection parts ES by using the second scan driver SDV2 and the third scan driver SDV3, it is possible to prevent or substantially reduce delay of a scan signal, caused by RC delay of the second and third scan lines S2p and S3q connected to the scan line connection parts ES. Thus, a desired scan signal can be supplied to the second and third scan lines S2p and S3q connected to the scan line connection parts ES.

Additionally, the second scan driver SDV2 and the third scan driver SDV3 are driven to be synchronized with each other, and accordingly can be driven by the same gate control signal GCS. For example, the third gate control signal GCS3 supplied to the third scan driver SDV3 may be set as a signal identical to the second gate control signal GCS2.

The first emission driver EDV1 may supply an emission control signal to the first emission control lines E11 to E1n in response to a fourth gate control signal GCS4. For example, the first emission driver EDV1 may sequentially supply the emission control signal to the first emission control lines E11 to E1n.

Here, the emission control signal may be set to have a width wider than that of the scan signal. For example, an emission control signal supplied to an ith (i is a natural number) first emission control line E1i may be supplied to overlap with, for at least a partial period, a scan signal supplied to an (i−1)th first scan line S1i−1 and a scan signal supplied to an ith first scan line S1i.

The second emission driver EDV2 may supply an emission control signal to the second emission control lines E21 to E2p in response to a fifth gate control signal GCS5. Here, the emission control signal supplied to second emission control line E2p connected to the emission control line connection parts EE from among the second emission control lines E21 to E2p may be supplied to third emission control lines E3q via the emission control line connection parts EE. The second emission driver EDV2 may sequentially supply the emission control signal to the second emission control lines E21 to E2p.

The third emission driver EDV3 may supply an emission control signal to the third emission control lines E31 to E3q in response to a sixth gate control signal GCSE. Here, the emission control signal supplied to third emission control lines E3q connected to the emission control line connection parts EE from among the third emission control lines E31 to E3q may be supplied to second emission control lines E2p via the emission control line connection parts EE. The third emission driver EDV3 may sequentially supply the emission control signal to the third emission control lines E31 to E3q.

Additionally, the emission control signal may be set to a gate-off voltage (e.g., a high voltage) such that transistors included in the pixels PXL can be turned off, and the scan signal may be set to a gate-on voltage (e.g., a low voltage) such that the transistors included in the pixels PXL can be turned on.

Because some of the second emission control lines E21 to E2p and some of the third emission control lines E31 to E3q are electrically connected to each other by the emission control line connection parts EE, the emission control signal of the second emission driver EDV2 and the emission control signal of the third emission driver EDV3, which are sequentially supplied to the second and third emission control lines E2p and E3q connected to the emission control line connection parts EE, are supplied to be synchronized with each other.

For example, the emission control signal supplied from the second emission driver EDV2 to the pth second emission control line E2p may be simultaneously supplied with the emission control signal supplied from the third emission driver EDV3 to the qth third emission control line E3q.

As described above, when the emission control signal is supplied to the second emission control lines E21 to E2p and the third emission control lines E31 to E3q by using the second emission driver EDV2 and the third emission driver EDV3, it is possible to prevent or substantially reduce delay of an emission control signal, caused by RC delay of the second emission control lines E21 to E2p and the third emission control lines E31 to E3q. Accordingly, a desired emission control signal can be supplied to the second emission control lines E21 to E2p and the third emission control lines E31 to E3q.

Additionally, the second emission driver EDV2 and the third emission driver EDV3 are driven to be synchronized with each other, and accordingly can be driven by the same gate control signal GCS. For example, the sixth gate control signal GCS6 supplied to the third emission driver EDV3 may be set as a signal identical to the fifth gate control signal GCS5.

The data driver DDV may supply a data signal to the data lines D1 to Dm in response to a data control signal DCS. The data signal supplied to the data lines D1 to Dm may be supplied to pixels PXL selected by the scan signal.

The timing controller TC may supply, to the scan drivers SDV and the emission drivers EDV, the gate control signals GCS1 to GCS6 generated based on timing signals supplied from the outside. Also, the timing controller TC may supply the data control signal DCS to the data driver DDV.

A start pulse and clock signals may be included in each of the gate control signals GCS1 to GCS6. The start pulse may control a timing of a first scan signal or a first emission control signal. The clock signals may be used to shift the start pulse.

A source start pulse and clock signals may be included in the data control signal DCS. The source start pulse may control a sampling start time of data. The clock signals may be used to control a sampling operation.

When the display device is sequentially driven, the first scan driver SDV1 may be supplied with the last output signal of the second scan driver SDV2 as the start pulse. Similarly, when the display device is sequentially driven, the first emission driver EDV1 may be supplied with the last output signal of the second emission driver EDV2 as the start pulse.

Figure 4:
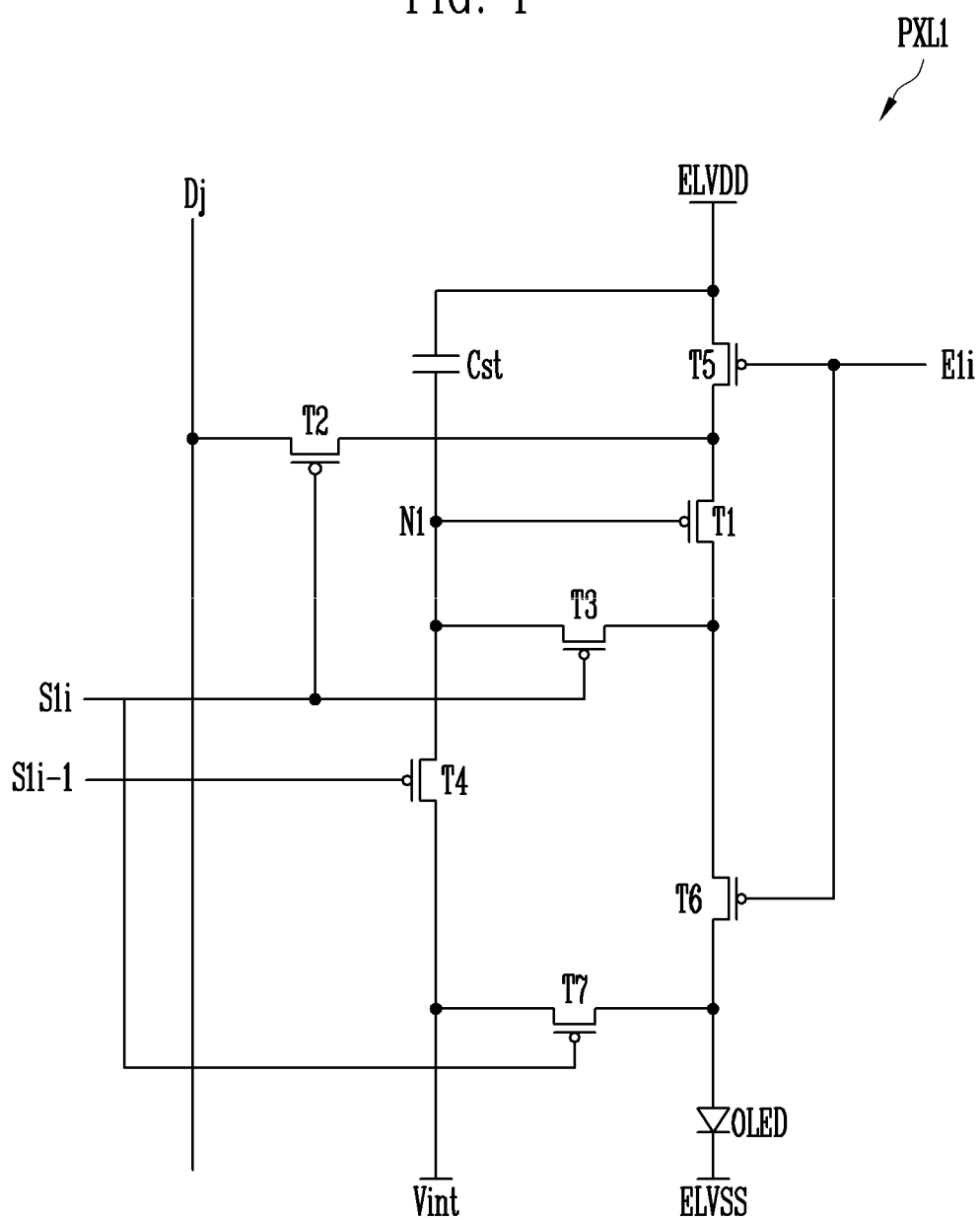
FIG. 4 is a circuit diagram illustrating an embodiment of a first pixel shown in FIG. 3.

FIG. 4 is a circuit diagram illustrating an embodiment of the first pixel shown in FIG. 3. For convenience of description, a pixel connected to a jth data line Dj and an ith first scan line S1i is illustrated in FIG. 4.

Referring to FIGS. 3 and 4, the first pixel PXL1 according to the present disclosure may include an organic light emitting diode OLED, a first transistor T1, a second transistor T2, a third transistor T3, a fourth transistor T4, a fifth transistor T5, a sixth transistor T6, a seventh transistor T7, and a storage capacitor Cst.

An anode of the organic light emitting diode OLED may be connected to the first transistor T1 via the sixth transistor T6, and a cathode of the organic light emitting diode OLED may be connected to the second power source ELVSS. The organic light emitting diode OLED generates light with a luminance (e.g., predetermined luminance) corresponding to the amount of current supplied from the first transistor T1.

The voltage of the first power source ELVDD may be set higher than that of the second power source ELVSS such that current can flow through the organic light emitting diode OLED.

The seventh transistor T7 may be connected between an initialization power source Vint and the anode of the organic light emitting diode OLED. In addition, a gate electrode of the seventh transistor T7 may be connected to the ith first scan line S1i. The seventh transistor T7 may be turned on when a scan signal is supplied to the ith first scan signal S1i, to supply the voltage of the initialization power source Vint to the anode of the organic light emitting diode OLED. Here, the initialization power source Vint may be set to a voltage lower than that of a data signal.

The sixth transistor T6 may be connected between the first transistor T1 and the organic light emitting diode OLED. In addition, a gate electrode of the sixth transistor T6 may be connected to an ith first emission control line E1i. The sixth transistor T6 may be turned off when an emission control signal is supplied to the ith first emission control line E1i, and be turned on otherwise.

The fifth transistor T5 may be connected between the first power source ELVDD and the first transistor T1. In addition, a gate electrode of the fifth transistor T5 may be connected to the ith first emission control line E1i. The fifth transistor T5 may be turned off when the emission control signal is supplied to the ith first emission control line E1i, and be turned on otherwise.

A first electrode of the first transistor (drive transistor) T1 may be connected to the first power source ELVDD via the fifth transistor T5, and a second electrode of the first transistor T1 may be connected to the anode of the organic light emitting diode OLED via the sixth transistor T6. In addition, a gate electrode of the first transistor T1 may be connected to a first node N1. The first transistor T1 may control the amount of current flowing from the first power source ELVDD to the second power source ELVSS via the organic light emitting diode OLED, corresponding to a voltage of the first node N1. That is, the first power source ELVDD may be electrically connected to the anode of the organic light emitting diode OLED.

The third transistor T3 may be connected between the second electrode of the first transistor T1 and the first node N1. In addition, a gate electrode of the third transistor T3 may be connected to the ith first scan line S1i. The third transistor T3 may be turned on when the scan signal is supplied to the ith first scan line S1i, to allow the second electrode of the first transistor T1 to be electrically connected to the first node N1. Therefore, when the third transistor T3 is turned on, the third transistor T3 may be diode-connected to the first transistor T1, and compensate for a threshold voltage of the first transistor T1. That is, the third transistor T3 may be a compensation transistor that compensates for the threshold voltage of the first transistor T1.

The fourth transistor T4 may be connected between the first node N1 and the initialization power source Vint. In addition, a gate electrode of the fourth transistor T4 may be connected to an (i−1)th first scan line S1i−1. The fourth transistor T4 may be turned on when a scan signal is supplied to the (i−1)th first scan line S1i−1, to supply the voltage of the initialization power source Vint to the first node N1.

The second transistor T2 may be connected between the jth data line Dj and the first electrode of the first transistor T1. In addition, a gate electrode of the second transistor T2 may be connected to the ith first scan line S1i. The second transistor T2 may be turned on when the scan signal is supplied to the ith first scan line S1i, to allow the jth data line Dj to be electrically connected to the first electrode of the first transistor T1.

The storage capacitor Cst may be connected between the first power source ELVDD and the first node N1. The storage capacitor Cst may store a voltage corresponding to the data signal and the threshold voltage of the first transistor T1.

Each of the second and third pixels PXL2 and PXL3 may be implemented with the same circuit as the first pixel PXL1. Therefore, detailed descriptions of the second and third pixels PXL2 and PXL3 will be omitted.

Figure 5:
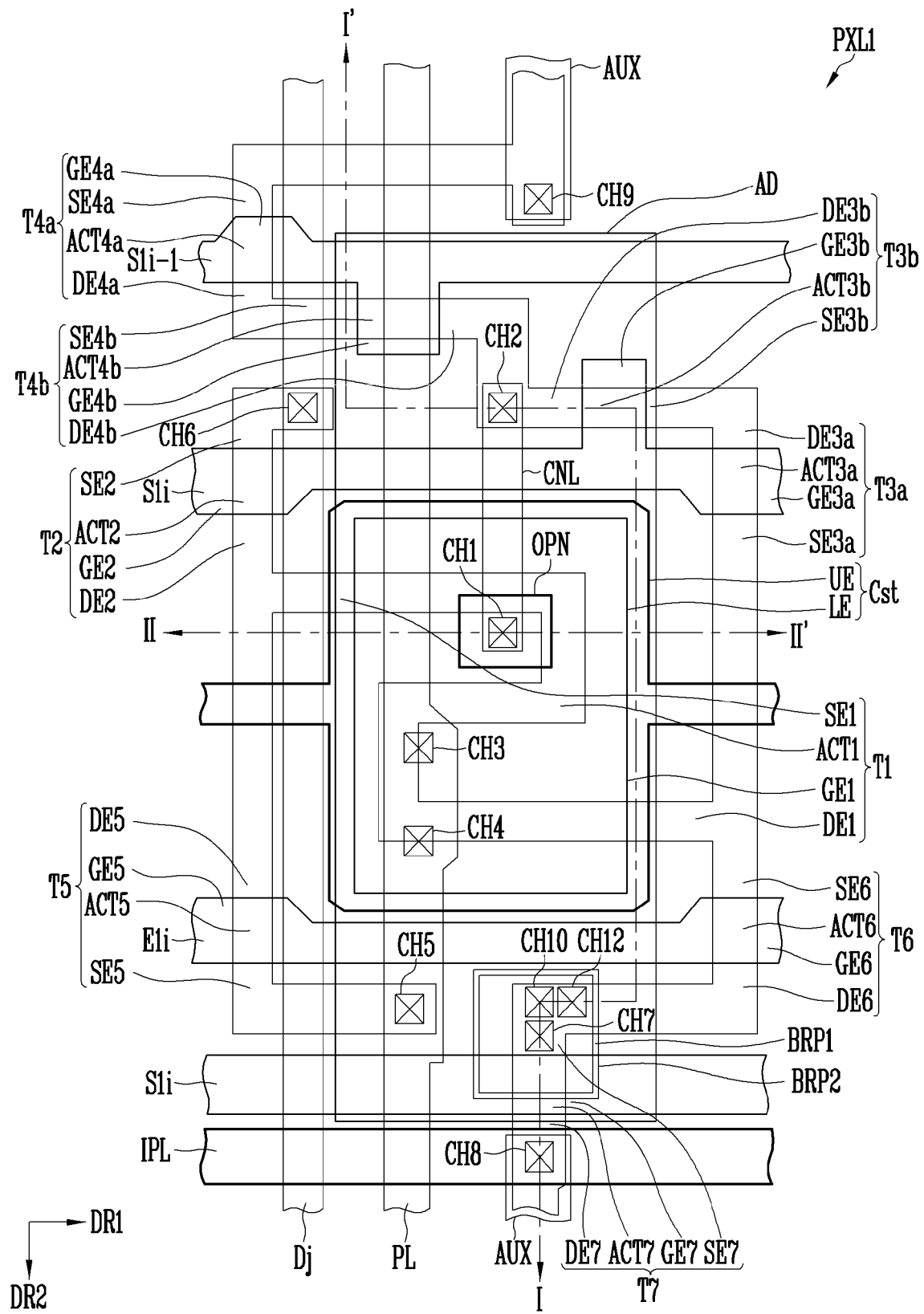
FIG. 5 is a plan view illustrating in detail the first pixel of FIGS. 3 and 4.
Figure 6:
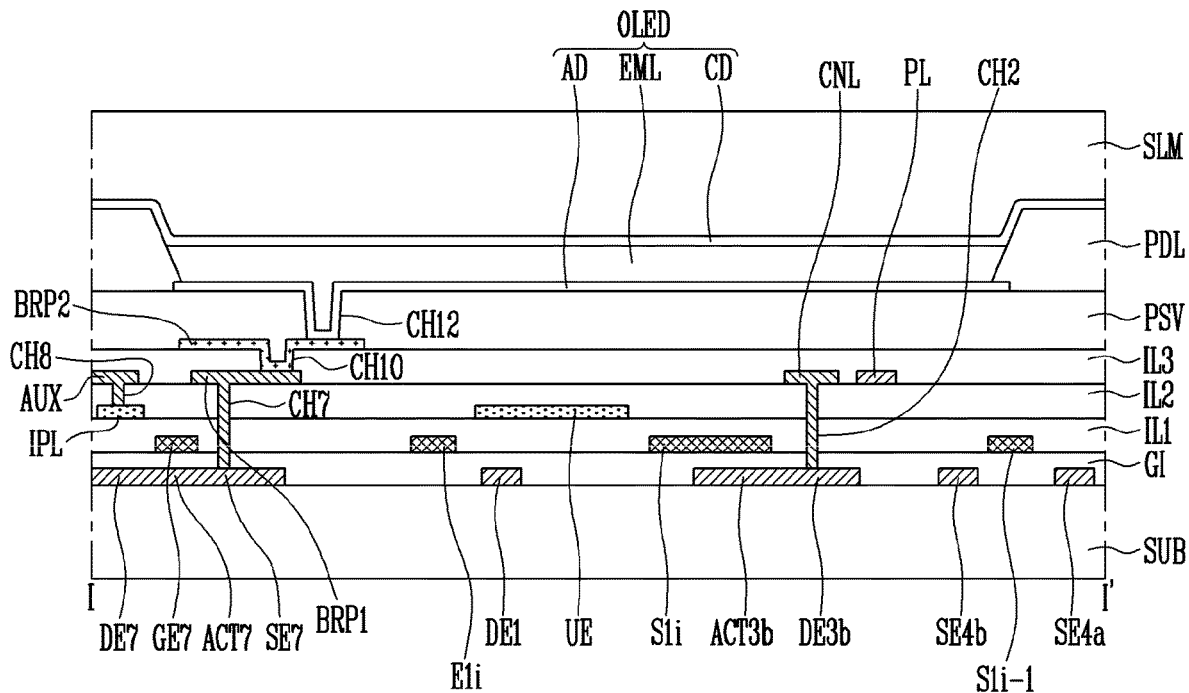
FIG. 6 is a sectional view taken along the line I-I' of FIG. 5.
Figure 7:
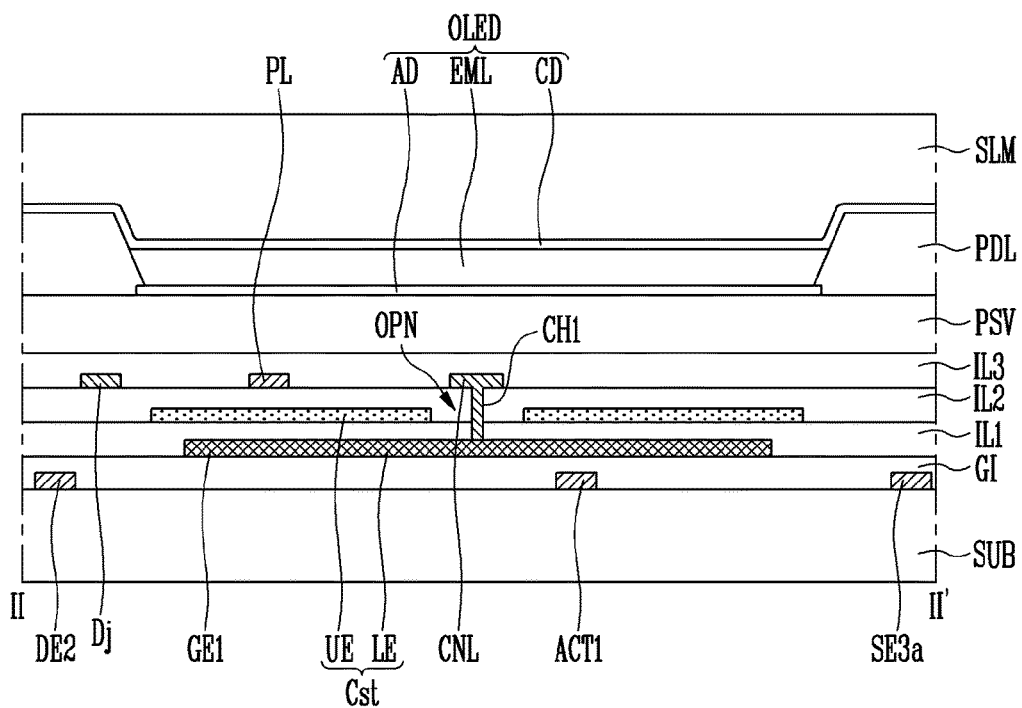
FIG. 7 is a sectional view taken along the line II-II' of FIG. 5.

FIG. 5 is a plan view illustrating in detail the first pixel of FIGS. 3 and 4. FIG. 6 is a sectional view taken along the line I-I' of FIG. 5. FIG. 7 is a sectional view taken along the line II-II' of FIG. 5.

Based on one first pixel PXL1 disposed on an ith row and a jth column in the first display region PXA1, two first scan lines S1i−1 and S1i, a first emission control line E1i, a power line PL, and a data line Dj, which are connected to the one first pixel PXL1, are illustrated in FIGS. 5 to 7. In FIGS. 6 and 7, for convenience of description, a first scan line on an (i−1)th row is referred to as an "(i−1)th first scan line S1i−1," a first scan line on the ith row is referred to as an "ith first scan line S1i," a first emission control line on the ith row is referred to as a "first emission control line E1i," a data line on the jth column is referred to as a "data line Dj," and a power line on the jth column is referred to as a "power line PL."

Referring to FIGS. 3 to 7, the display device may include a substrate SUB, a line unit, and pixels, for example, first pixels PXL1.

The substrate SUB may include a transparent insulating material to enable light to be transmitted therethrough. The substrate SUB may be a rigid substrate. For example, the substrate SUB may be one of a glass substrate, a quartz substrate, a glass ceramic substrate, and a crystalline glass substrate.

In addition, the substrate SUB may be a flexible substrate. Here, the substrate SUB may be one of a film substrate and a plastic substrate, which includes a polymer organic material. For example, the substrate SUB may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and/or the like. However, the material constituting the substrate SUB may be variously changed in any suitable manner, and may include a fiber reinforced plastic (FRP), and/or the like.

The line unit provides signals to each of the first pixels PXL1, and may include first scan lines S1i-1 and S1i, a data line Dj, a first emission control line E1i, a power line PL, and an initialization power line IPL.

The first scan lines S1i-1 and S1i may extend in a first direction DR1. The first scan lines S1i-1 and S1i may include an (i-1)th first scan line S1i-1 and an ith first scan line S1i, which are sequentially arranged along a second direction DR2. The first scan lines S1i-1 and S1i may be applied with scan signals. For example, the (i-1)th first scan line S1i-1 may be applied with an (i-1)th first scan signal, and the ith first scan line S1i may be applied with an ith first scan signal. The ith first scan line S1i may branch off into two lines, and the branching-off ith first scan lines S1i may be connected to transistors different from each other.

The first emission control line E1i may extend in the first direction DR1. The first emission control line E1i may be applied with an emission control signal.

The data line Dj may extend in the second direction DR2. The data line Dj may be applied with a data signal.

The power line PL may extend along the second direction DR2. The power line PL may be disposed to be spaced apart from the data line Dj. The power line PL may be applied with the first power source ELVDD.

The initialization power line IPL may extend along the first direction DR1. The initialization power line IPL may be applied with the initialization power source Vint.

Each first pixel PXL1 may include a first transistor T1, a second transistor T2, a third transistor T3, a fourth transistor T4, a fifth transistor T5, a sixth transistor T6, a seventh transistor T7, a storage capacitor Cst, and an organic light emitting diode OLED.

The first transistor T1 may include a first gate electrode GE1, a first active pattern ACT1, a first source electrode SE1, and a first drain electrode DE1.

The first gate electrode GE1 may be connected to a third drain electrode DE3 of the third transistor T3 and a fourth drain electrode DE4 of the fourth transistor T4. The connection line CNL may connect between the first gate electrode GE1 and the third and fourth drain electrodes DE3 and DE4. One end of the connection line CNL may be connected to the first gate electrode GE1 through a first contact hole (e.g., a first contact opening) CH1, and the other end of the connection line CNL may be connected to the third and fourth drain electrodes DE3 and DE4 through a second contact hole (e.g., a second contact opening) CH2.

In an embodiment of the present disclosure, the first active pattern ACT1, the first source electrode SE1, and the first drain electrode DE1 may be formed of a semiconductor layer undoped or doped with impurities. For example, the first source electrode SE1 and the first drain electrode DE1 may be formed of a semiconductor layer doped with impurities, and the first active pattern ACT1 may be formed of a semiconductor layer undoped with impurities.

The first active pattern ACT1 has a bar shape extending in a set or predetermined direction, and may have a shape in which it is bent once or more along the extending direction. When viewed on a plane, the first active pattern ACT1 may overlap with the first gate electrode GE1. As the first active pattern ACT1 is formed long, a channel region of the first transistor T1 can be formed long. Thus, the driving range of a gate voltage applied to the first transistor T1 can be widened. Accordingly, the gray scale of light emitted from the organic light emitting diode OLED can be minutely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, a second source electrode SE2, and the second drain electrode DE2.

The second gate electrode GE2 may be connected to the ith first scan line S1i. The second gate electrode GE2 may be provided as a portion of the ith first scan line S1i or may be provided in a shape protruding from the ith first scan line S1i.

The second active pattern ACT2, the second source electrode SE2, and the second drain electrode DE2 may be formed of a semiconductor undoped or doped with impurities. For example, the second source electrode SE2 and the second drain electrode DE2 may be formed of a semiconductor doped with impurities, and the second active pattern ACT2 may be formed of a semiconductor layer undoped with impurities. The second active pattern ACT2 may correspond to a portion overlapping with the second gate electrode GE2. One end of the second source electrode SE2 may be connected to the second active pattern ACT2. The other end of the second source electrode SE2 may be connected to the data line Dj through a sixth contact hole (e.g., a sixth contact opening) CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may be provided in a double gate structure so as to prevent or reduce a leakage current. That is, the third transistor T3 may include a 3ath transistor T3a and a 3bth transistor T3b. The 3ath transistor T3a may include a 3ath gate electrode GE3a, a 3ath active pattern ACT3a, a 3ath source electrode SE3a, and a 3ath drain electrode DE3a. The 3bth transistor T3b may include a 3bth gate electrode GE3b, a 3bth active pattern ACT3b, a 3bth source electrode SE3b, and a 3bth drain electrode DE3b. Hereinafter, the 3ath gate electrode GE3a and the 3bth gate electrode GE3b are referred to as a third gate electrode GE3, the 3ath active pattern ACT3a and the 3bth active pattern ACT3b are referred to as a third active pattern ACT3, the 3ath source electrode SE3a and the 3bth source electrode SE3b are referred to as the third source electrode SE3, and the 3ath drain electrode DE3a and the 3bth drain electrode DE3b are referred to as the third drain electrode DE3.

The third gate electrode GE3 may be connected to the ith first scan line S1i. The third gate electrode GE3 may be provided as a portion of the ith first scan line S1i or may be provided in a shape protruding from the ith first scan line S1$i$. For example, the 3ath gate electrode GE3$a$ may be provided in a shape protruding from the ith first scan line S1$i$, and the 3bth gate electrode GE3$b$ may be provided as a portion of the ith first scan line S1$i$.

The third active pattern ACT3, the third source electrode SE3, and the third drain electrode DE3 may be formed of a semiconductor layer undoped or doped with impurities. For example, the third source electrode SE3 and the third drain electrode DE3 may be formed of a semiconductor layer doped with impurities, and the third active pattern ACT3 may be formed of a semiconductor layer undoped with impurities.

The third active pattern ACT3 may correspond to a portion overlapping with the third gate electrode GE3. One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Also, the third drain electrode DE3 may be connected to the first gate electrode GE1 of the first transistor T1 through the connection line CNL, the second contact hole CH2, and the first contact hole CH1.

The fourth transistor T4 may be provided in a double gate structure so as to prevent or reduce a leakage current. That is, the fourth transistor T4 may include a 4ath transistor T4$a$ and a 4bth transistor T4$b$. The 4ath transistor T4$a$ may include a 4ath gate electrode GE4$a$, a 4ath active pattern ACT4$a$, a 4ath source electrode SE4$a$, and a 4ath drain electrode DE4$a$, and the 4bth transistor T4$b$ may include a 4bth gate electrode GE4$a$, a 4bth active pattern ACT4$a$, a 4bth source electrode SE4$a$, and a 4bth drain electrode DE4$b$. Hereinafter, the 4ath gate electrode GE4$a$ and the 4bth gate electrode GE4$b$ are referred to as a fourth gate electrode GE4, the 4ath active pattern ACT4$a$ and the 4bth active pattern ACT4$b$ are referred to as a fourth active pattern ACT4, the 4ath source electrode SE4$a$ and the 4bth source electrode SE4$b$ are referred to as a fourth source electrode SE4, and the 4ath drain electrode DE4$a$ and the 4bth drain electrode DE4$b$ are referred to as the fourth drain electrode DE4.

The fourth gate electrode GE4 may be connected to the (i−1)th first scan line S1$i$−1. The fourth gate electrode GE4 may be provided as a portion of the (i−1)th first scan line S1$i$−1 or may be provided in a shape protruding from the (i−1)th first scan line S1$i$−1. For example, the 4ath gate electrode GE4$a$ may be provided as a portion of the (i−1)th first scan line S1$i$−1. The 4bth gate electrode GE4$b$ may be provided in a shape protruding from the (i−1)th first scan line S1$i$−1.

The fourth active pattern ACT4, the fourth source electrode SE4, and the fourth drain electrode DE4 may be formed of a semiconductor layer undoped or doped with impurities. The fourth source electrode SE4 and the fourth drain electrode DE4 may be formed of a semiconductor layer doped with impurities, and the fourth active pattern ACT4 may be formed of a semiconductor layer undoped with impurities.

The fourth active pattern ACT4 may correspond to a portion overlapping with the fourth gate electrode GE4. One end of the fourth source electrode SE4 may be connected to the fourth active pattern ACT4. The other end of the fourth source electrode SE4 may be connected to a seventh drain electrode DE7 of a seventh transistor T7 of a pixel on a previous row. An auxiliary connection line AUX may be provided between the fourth source electrode SE4 and the initialization power line IPL. One end of the auxiliary connection line AUX may be connected to the fourth source electrode SE4 through a ninth contact hole (e.g., a ninth contact opening) CH9. The other end of the auxiliary connection line AUX may be connected to an initialization power line IPL on the previous row through an eighth contact hole (e.g., an eighth contact opening) CH8 on the previous row. One end of the fourth drain electrode DE4 may be connected to the fourth active pattern ACT4, and the other end of the fourth drain electrode DE4 may be connected to the third drain electrode DE3 of the third transistor T3. Also, the fourth drain electrode DE4 may be connected to the first gate electrode GE1 of the first transistor T1 through the connection line CNL, the second contact hole CH2, and first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the first emission control line E1$i$. The fifth gate electrode GE5 may be provided as a portion of the first emission control line E1$i$ or may be provided in a shape protruding from the first emission control line E1$i$.

The fifth active pattern ACT, the fifth source electrode SE5, and the fifth drain electrode DE5 may be formed of a semiconductor layer undoped or doped with impurities. For example, the fifth source electrode SE5 and the fifth drain electrode DE5 may be formed of a semiconductor layer doped with impurities, and the fifth active pattern ACT5 may be formed of a semiconductor layer undoped with impurities.

The fifth active pattern ACT5 may correspond to a portion overlapping with the fifth gate electrode GE5. One end of the fifth source electrode SE5 may be connected to the fifth active pattern ACT5. The other end of the fifth source electrode SE5 may be connected to the power line PL through a fifth contact hole (e.g., a fifth contact opening) CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode GE6 may be connected to the first emission control line E1$i$. The sixth gate electrode GE6 may be provided as a portion of the first emission control line E1$i$ or may be provided in a shape protruding from the first emission control line E1$i$.

The sixth active pattern ACT6, the sixth source electrode SE6, and the sixth drain electrode DE6 may be formed of a semiconductor layer undoped or doped with impurities. For example, the sixth source electrode SE6 and the sixth drain electrode DE6 may be formed of a semiconductor layer doped with impurities, and the sixth active pattern ACT6 may be formed of a semiconductor layer undoped with impurities.

The sixth active pattern ACT6 may correspond to a portion overlapping with the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and a seventh drain electrode DE7.

The seventh gate electrode GE7 may be connected to the ith first scan line S1$i$. The seventh gate electrode GE7 may be provided as a portion of the ith first scan line S1$i$ or may be provided in a shape protruding from the ith first scan line S1$i$.

The seventh active pattern ACT7, the seventh source electrode SE7, and the seventh drain electrode DE7 may be formed of a semiconductor layer undoped or doped with impurities. For example, the seventh source electrode SE7 and the seventh drain electrode DE7 may be formed of a semiconductor layer doped with impurities, and the seventh active pattern ACT7 may be formed of a semiconductor layer undoped with impurities.

The seventh active pattern ACT7 may correspond to a portion overlapping with the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power line IPL. Also, the seventh drain electrode DE7 may be connected to a fourth source electrode SE4 of a fourth transistor T4 of a pixel on a subsequent row. The seventh drain electrode DE7 and the fourth source electrode SE4 of the fourth transistor T4 on the subsequent row may be connected to each other through the auxiliary connection line AUX, the eighth contact hole CH8, and the ninth contact hole CH9.

The storage capacitor Cst may include a lower electrode LE and an upper electrode UE. The lower electrode LE may be configured as the first gate electrode GE1 of the first transistor T1.

When viewed on a plane, the upper electrode UE overlaps with the first gate electrode GE1, and may cover the lower electrode LE. As the overlapping area of the upper electrode UE and the lower electrode LE is widened, the capacitance of the storage capacitor Cst may be increased. The upper electrode UE may extend in the first direction DR1. In an embodiment of the present disclosure, the upper electrode UE may be connected to the power line PL through a third contact hole (e.g., a third contact opening) CH3 and a fourth contact hole (e.g., a fourth contact opening) CH4. Therefore, a voltage having the same level as the first power source ELVDD may be applied to the upper electrode UE. The upper electrode UE may have an opening OPN in a region including the first contact hole CH1 through which the first gate electrode GE1 and the connection line CNL are in contact with each other.

The organic light emitting diode OLED may include a first electrode AD, a second electrode CD, and an emitting layer EML provided between the first electrode AD and the second electrode CD.

The first electrode AD may be provided in a light emitting region corresponding to each pixel PXL1. The first electrode AD may be connected to the seventh source electrode SE7 of the seventh transistor T7 and the sixth drain electrode DE6 of the sixth transistor T6 through a seventh contact hole (e.g., a seventh contact opening) CH7, a tenth contact hole (e.g., a tenth contact opening) CH10, and a twelfth contact hole (e.g., a twelfth contact opening) CH12. A first bridge pattern BRP1 may be provided between the seventh contact hole CH7 and the tenth contact hole CH10. A second bridge pattern BRP2 may be provided between the tenth contact hole CH10 and the twelfth contact hole CH12. The first bridge pattern BRP1 and the second bridge pattern BRP2 may electrically connect the sixth drain electrode DE6, the seventh source electrode SE7, and the first electrode AD therethrough.

Hereinafter, a structure of the display device according to the embodiment of the present disclosure will be described along a stacking order with reference to FIGS. 5 to 7.

The active patterns ACT1 to ACT7 may be provided on the substrate SUB. The active patterns ACT1 to ACT7 may include the first to seventh active patterns ACT1 to ACT7. The first to seventh active patterns ACT1 to ACT7 may include a semiconductor material.

A buffer layer may be provided between the substrate SUB and the first to seventh active patterns ACT1 to ACT7.

A gate insulating layer GI may be provided on the substrate SUB on which the first to seventh active patterns ACT1 to ACT7 are formed.

The gate insulating layer GI may include at least one of an organic insulating layer and an inorganic insulating layer. The organic insulating layer may include an organic insulating material to enable light to be transmitted therethrough. For example, the organic insulating layer may include photoresist, polyacrylate resin, epoxy resin, phenolic resin, polyamide resin, polyimide resin, unsaturated polyester resin, polyphenylene ether resin, polyphenylene sulfide resin, benzocyclobutene resin, and/or the like. The inorganic insulating layer may include silicon oxide, silicon nitride, silicon oxynitride, and/or the like.

The (i−1)th first scan line S1$i$−1, the ith first scan line S1$i$, the first emission control line E1$i$, and the first to seventh gate electrodes GE1 to GE7 may be provided on the gate insulating layer GI. The first gate electrode GE1 may become the lower electrode LE of the storage capacitor Cst. The second gate electrode GE2 and the third gate electrode GE3 may be integrally formed with the ith first scan line S1$i$. The fourth gate electrode GE4 may be integrally formed with the (i−1)th first scan line S1$i$−1. The fifth gate electrode GE5 and the sixth gate electrode GE6 may be integrally formed with the first emission control line E1$i$. The seventh gate electrode GE7 may be integrally formed with the ith first scan line S1$i$.

The (i−1)th first scan line S1$i$−1, the ith first scan line S1$i$, the first emission control line E1$i$, and the first to seventh gate electrodes GE1 to GE7 may include a metallic material. For example, the (i−1)th first scan line S1$i$−1, the ith first scan line S1$i$, the first emission control line E1$i$, and the first to seventh gate electrodes GE1 to GE7 may include gold (Au), silver (Ag), aluminum (Al), molybdenum (Mo), chromium (Cr), titanium (Ti), nickel (Ni), neodymium (Nd), copper (Cu), any alloy thereof, and/or the like. The (i−1)th first scan line S1$i$−1, the ith first scan line S1$i$, the first emission control line E1$i$, and the first to seventh gate electrodes GE1 to GE7 may be formed in a single layer, but the present disclosure is not limited thereto. For example, the (i−1)th first scan line S1$i$−1, the ith first scan line S1$i$, the first emission control line E1$i$, and the first to seventh gate electrodes GE1 to GE7 may be formed in a multi-layer in which two or more layers including gold (Au), silver (Ag), aluminum (Al), molybdenum (Mo), chromium (Cr), titanium (Ti), nickel (Ni), neodymium (Nd), copper (Cu), any alloy thereof, and/or the like, are stacked.

A first interlayer insulating layer IL1 may be provided over the (i−1)th first scan line S1i−1, the ith first scan line S1i, the first emission control line E1i, and the first to seventh gate electrodes GE1 to GE7. The first interlayer insulating layer IL1 may include polysiloxane, silicon oxide, silicon nitride, silicon oxynitride, and/or the like.

The upper electrode UE of the storage capacitor Cst and the initialization power line IPL may be provided on the first interlayer insulating layer IL1. The upper electrode UE may cover the lower electrode LE. The upper electrode UE along with the lower electrode LE may constitute the storage capacitor Cst with the first interlayer insulating layer IL1 interposed therebetween. The upper electrode UE and the initialization power line IPL may be formed in a single layer or a multi-layer, which includes gold (Au), silver (Ag), aluminum (Al), molybdenum (Mo), chromium (Cr), titanium (Ti), nickel (Ni), neodymium (Nd), copper (Cu), any alloy thereof, and/or the like.

A second interlayer insulating layer IL2 may be provided on the substrate SUB on which the upper electrode UE and the initialization power line IPL are disposed.

The second interlayer insulating layer IL2 may include at least one of an inorganic insulating layer and an organic insulating layer. For example, the second interlayer insulating layer IL2 may include at least one inorganic insulating layer. The inorganic insulating layer may include silicon oxide, silicon nitride, silicon oxynitride, and/or the like. Also, the second interlayer insulating layer IL2 may include at least one organic insulating layer. The organic insulating layer may include photoresist, polyacrylate resin, epoxy resin, phenolic resin, polyamide resin, polyimide resin, unsaturated polyester resin, polyphenylene ether resin, polyphenylene sulfide resin, benzocyclobutene resin, and/or the like. In addition, the second interlayer insulating layer IL2 may have a multi-layered structure including at least one inorganic insulating layer and at least one organic insulating layer.

The data line Dj, the connection line CNL, the power line PL, the auxiliary connection line AUX, and the first bridge pattern BRP1 may be provided on the second interlayer insulating layer IL2.

The data line Dj may be connected to the second source electrode SE2 through the sixth contact hole CH6 passing through the first interlayer insulating layer IL1, the second interlayer insulating layer IL2, and the gate insulating layer GI.

One end of the connection line CNL may be connected to the first gate electrode GE1 through the first contact hole CH1 passing through the first interlayer insulating layer IL1 and the second interlayer insulating layer IL2. In addition, the other end of the connection line CNL may be connected to the third drain electrode DE3 and the fourth drain electrode DE4 through the second contact hole CH2 passing through the gate insulating layer GI, the first interlayer insulating layer IL1, and the second interlayer insulating layer IL2.

The auxiliary connection line AUX may be connected to the initialization power line IPL through the eighth contact hole CH8 passing through the second interlayer insulating layer IL2. Also, the auxiliary connection line AUX may be connected to the fourth source electrode SE4 and a seventh drain electrode DE7 of a first pixel PXL1 on an (i−1)th row through the ninth contact hole CH9 passing through the gate insulating layer GI, the first interlayer insulating layer IL1, and the second interlayer insulating layer IL2.

The first bridge pattern BRP1 may be a pattern provided as a medium connecting the sixth drain electrode DE6 to the first electrode AD between the sixth drain electrode DE6 and the first electrode AD. The first bridge pattern BRP1 may be connected to the sixth drain electrode DE6 and the seventh source electrode SE7 through the seventh contact hole CH7 passing through the gate insulating layer GI, the first interlayer insulating layer IL1, and the second interlayer insulating layer IL2.

A third interlayer insulating layer IL3 may be provided on the substrate SUB on which the jth data line Dj and the like are formed.

The third interlayer insulating layer IL3 may include at least one of an inorganic insulating layer and an organic insulating layer. For example, the third interlayer insulating layer IL3 may include a first insulating layer including an inorganic insulating material and a second insulating layer that is provided on the first insulating layer and includes an organic insulating material. Here, the first insulating layer may include polysiloxane, silicon oxide, silicon nitride, and/or silicon oxynitride. The second insulating layer may include at least one of photoresist, polyacrylate resin, epoxy resin, phenolic resin, polyamide resin, polyimide resin, unsaturated polyester resin, polyphenylene ether resin, polyphenylene sulfide resin, benzocyclobutene resin, and the like.

The second bridge pattern BRP2 may be provided on the third interlayer insulating layer IL3. The second bridge pattern BRP2 may be connected to the first bridge pattern BRP1 through the tenth contact hole CH10.

The power line PL may be connected to the upper electrode UE of the storage capacitor Cst through the third and fourth contact holes CH3 and CH4 passing through the second interlayer insulating layer IL2. The power line PL may be connected to the fifth source electrode SE5 through the fifth contact hole CH5 passing through the first interlayer insulating layer IL1, the second interlayer insulating layer IL2, and the gate insulating layer GI.

A protective layer PSV may be provided on the third interlayer insulating layer IL3 on which the second bridge pattern BRP2 is provided.

The protective layer PSV may include an organic insulating material. For example, the protective layer PSV may include photoresist, polyacrylate resin, epoxy resin, phenolic resin, polyamide resin, polyimide resin, unsaturated polyester resin, polyphenylene ether resin, polyphenylene sulfide resin, benzocyclobutene resin, and/or the like.

The organic light emitting diode OLED may be provided on the protective layer PSV. The organic light emitting diode OLED may include the first electrode AD, the second electrode CD, and the emitting layer EML provided between the first electrode AD and the second electrode CD.

The first electrode AD may be provided on the protective layer PSV. The first electrode AD may be connected to the second bridge pattern BRP2 through the twelfth contact hole CH12 passing through the protective layer PSV. The first electrode AD can be electrically connected to the first bridge pattern BRP1. Because the first bridge pattern BRP1 is connected to the sixth drain electrode DE6 through the seventh contact hole CH7, the first electrode AD can be electrically connected to the sixth drain electrode DE6. Therefore, the first electrode AD may be electrically connected to the sixth drain electrode DE6 and the seventh source electrode SE7.

A pixel defining layer PDL defining a light emitting region to correspond to each pixel PXL1 may be provided on the substrate SUB on which the first electrode AD and the like are formed. The pixel defining layer PDL may expose a top surface of the first electrode AD therethrough. The exposed region of the first electrode AD may be a light emitting region.

The pixel defining layer PDL may include an organic insulating material. For example, the pixel defining layer PDL may include polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, silane based resin, and/or the like.

The emitting layer EML may be provided in the light emitting region of the first electrode AD, and the second electrode CD may be provided on the emitting layer EML. An encapsulation layer SLM that covers the second electrode CD may be provided over the second electrode CD.

One of the first electrode AD and the second electrode CD may be an anode electrode, and the other of the first electrode AD and the second electrode CD may be a cathode electrode. For example, the first electrode AD may be an anode electrode, and the second electrode CD may be a cathode electrode.

In addition, at least one of the first electrode AD and the second electrode CD may be a light transmissive (e.g., transparent) electrode. For example, when the organic light emitting diode OLED is a bottom-emission organic light emitting device, the first electrode AD may be a light transmissive electrode, and the second electrode CD is a reflective electrode. When the organic light emitting diode OLED is a top-emission organic light emitting device, the first electrode AD may be a reflective electrode, and the second electrode CD may be a light transmissive electrode. When the organic light emitting diode OLED is a dual-emission light emitting device, both of the first electrode AD and the second electrode CD may be light transmissive electrodes. In this embodiment, a case where the organic light emitting diode OLED is a top-emission organic light emitting device, and the first electrode AD is an anode electrode is described as an example.

The first electrode AD may include a reflective layer capable of reflecting light and a transparent conductive layer disposed on the top or bottom of the reflective layer. At least one of the transparent conductive layer and the reflective layer may be electrically connected to the sixth drain electrode DE6 and the seventh source electrode SE7.

The reflective layer may include a material capable that enables light to be reflected therefrom. For example, the reflective layer may include at least one selected from the group consisting of aluminum (Al), silver (Ag), chromium (Cr), molybdenum (Mo), platinum (Pt), nickel (Ni), and alloys thereof.

The transparent conductive layer may include a transparent conductive oxide. For example, the transparent conductive layer may include at least one transparent conductive oxide selected from the group consisting of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The emitting layer EML may be disposed on the light emitting region of the first electrode AD. The emitting layer EML may have a multi-layered thin film structure at least including a light generation layer (LGL). For example, the emitting layer EML may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron injection layer (EIL) for injecting electrons. In the emitting layer EML, the HIL, HTL, HBL, ETL, and EIL may be common layers commonly disposed in adjacent pixels PXL.

The second electrode CD may be a semi light-transmissive (e.g., a semi-transparent) reflective layer. For example, the second electrode CD may be a thin metal layer having a thickness, through which light emitted through the emitting layer EML can be transmitted. The second electrode CD may transmit a portion of the light emitted from the emitting layer EML therethrough, and may reflect the rest of the light emitted from the emitting layer EML.

The second electrode CD may include a material having a work function lower than that of the transparent conductive layer. For example, the second electrode CD may be include molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), alloys thereof, and/or the like.

A portion of the light emitted from the emitting layer EML may not be transmitted through the second electrode CD, and the light reflected from the second electrode CD may be again reflected from the reflective layer. That is, the light emitted from the emitting layer EML may resonate between the reflective layer and the second electrode CD. The light extraction efficiency of the organic light emitting diode OLED can be improved (e.g., increased) by the resonance of the light.

The distance between the reflective layer and the second electrode CD may be changed depending on a color of the light emitted from the emitting layer EML. That is, the distance between the reflective layer and the second electrode CD may be adjusted to satisfy constructive interference of the light emitted from the emitting layer EML, depending on a color of the light emitted from the emitting layer EML.

The encapsulation layer SLM can prevent or substantially prevent oxygen and moisture from penetrating into the organic light emitting diode OLED. The encapsulation layer SLM may include a plurality of inorganic layers and a plurality of organic layers. For example, the encapsulation layer SLM may include a plurality unit encapsulation layers including the inorganic layer and the organic layer disposed on the inorganic layer. In addition, the inorganic layer may be disposed at the uppermost portion of the encapsulation layer SLM. The inorganic layer may include at least one selected from the group consisting of silicon oxide, silicon nitride, silicon oxynitride, aluminum oxide, titanium oxide, zirconium oxide, and tin oxide.

In an embodiment of the present disclosure, the second pixel PXL2 provided in the second display region PXA2 and the third pixel PXL3 provided in the third display region PXA3 have the substantially same pixel structure as the first pixel PXL1, and therefore, their descriptions will be omitted.

Figure 8:
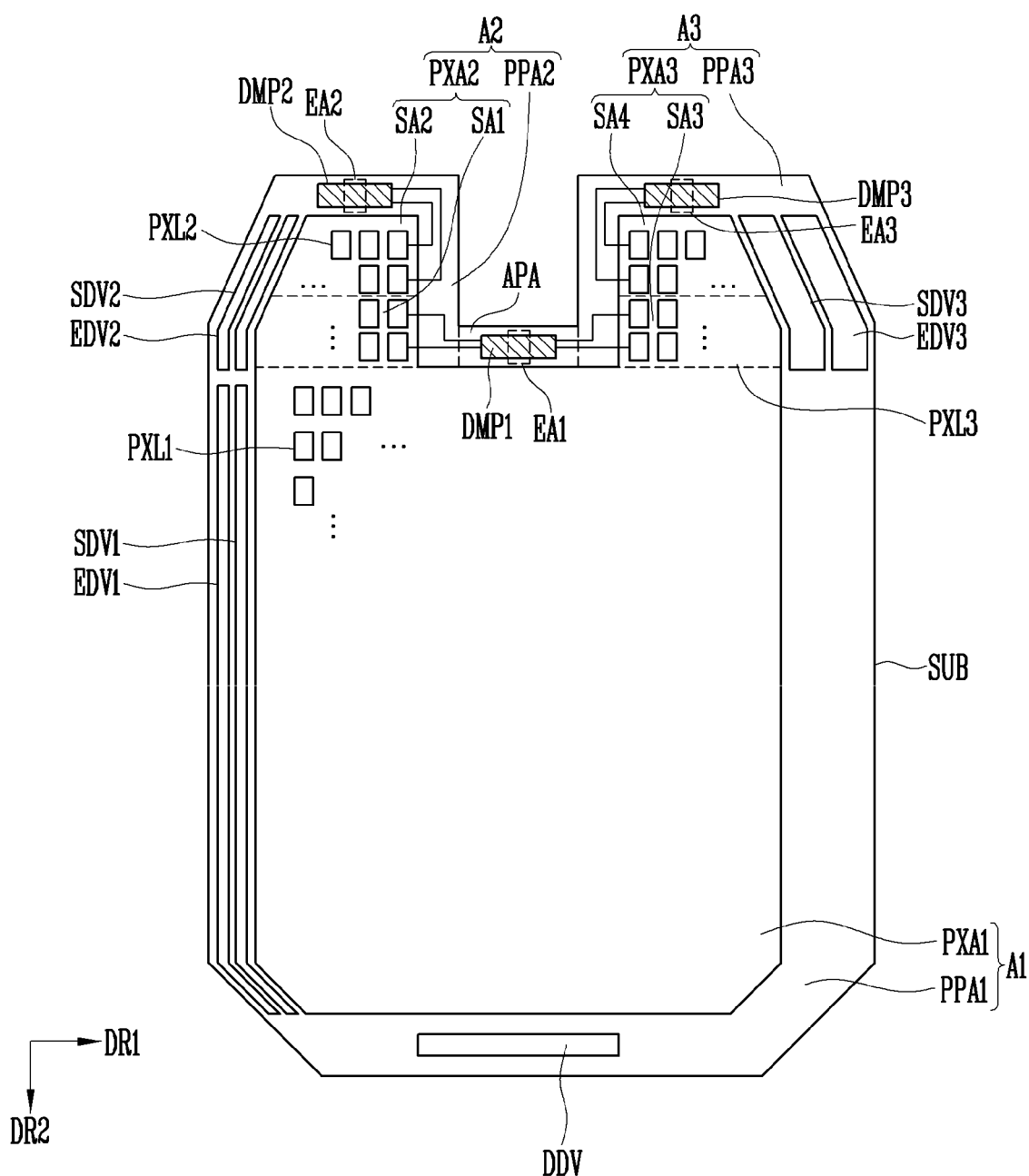
FIG. 8 is a plan view illustrating a display device according to an embodiment of the present disclosure.
Figure 9:
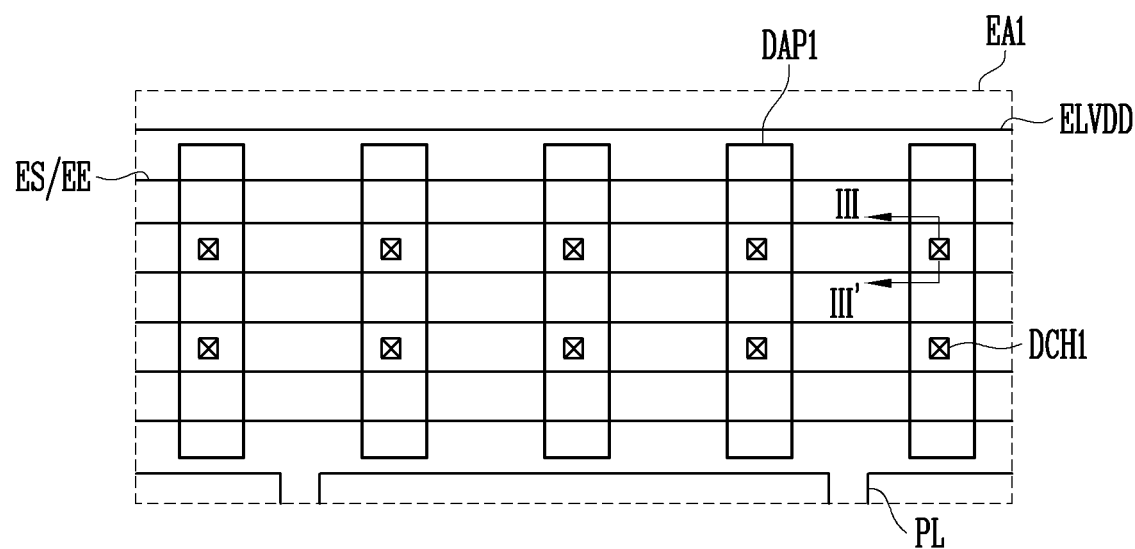
FIGS. 9 to 11 are enlarged views of the region EA1 shown in FIG. 8.
Figure 10:
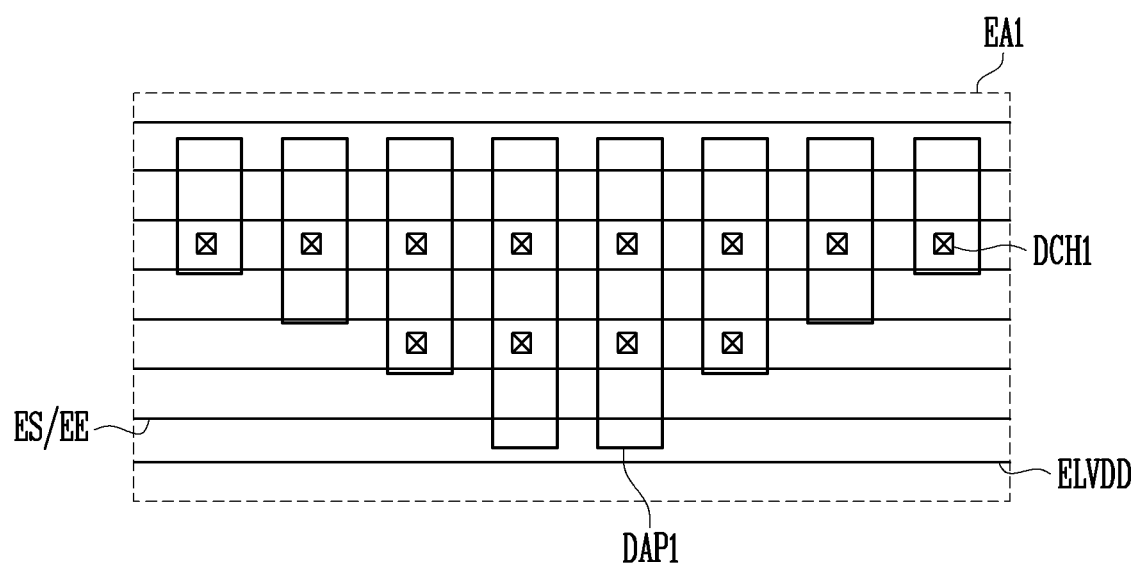
Figure 11:
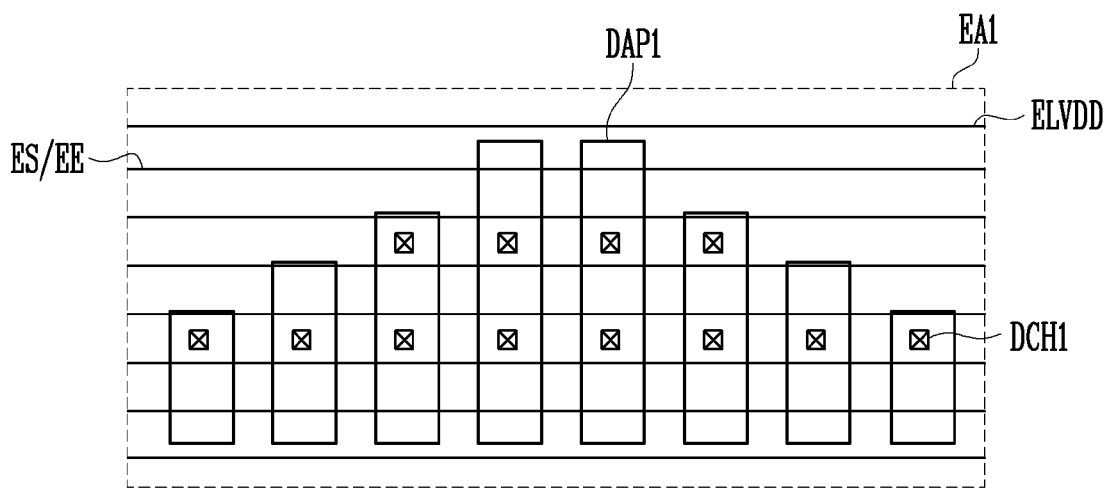
Figure 12:
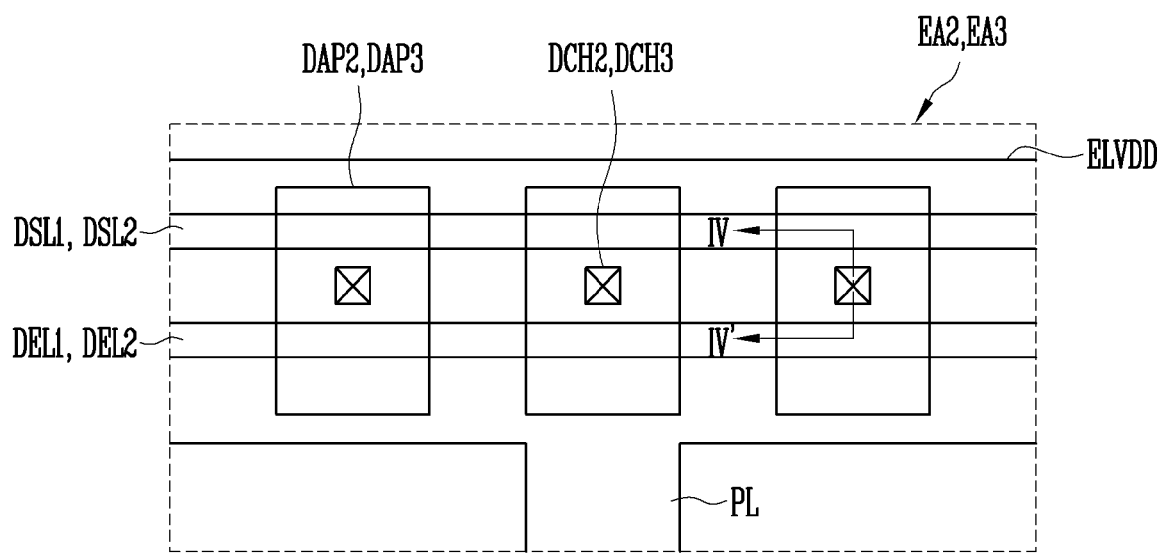
FIG. 12 is an enlarged view of the region EA2 or the region EA3 shown in FIG. 8.
Figure 13:
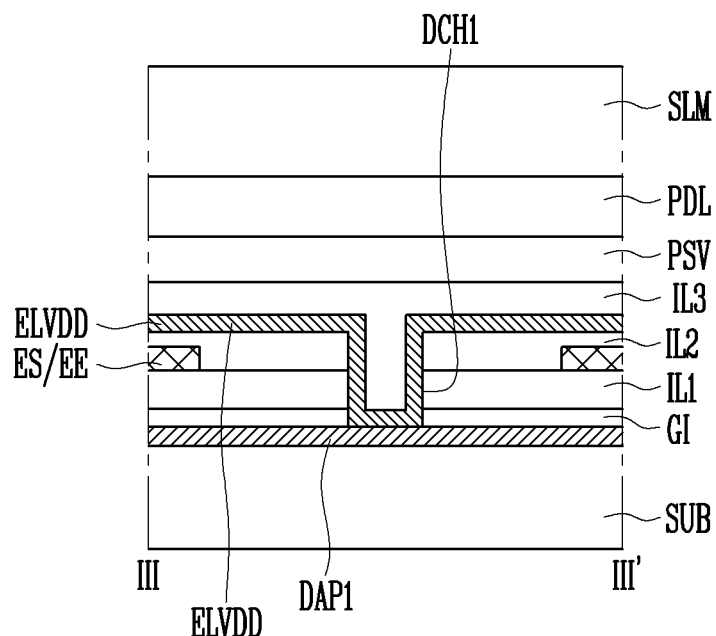
FIG. 13 is a sectional view taken along the line III-III' of FIG. 9.
Figure 14:
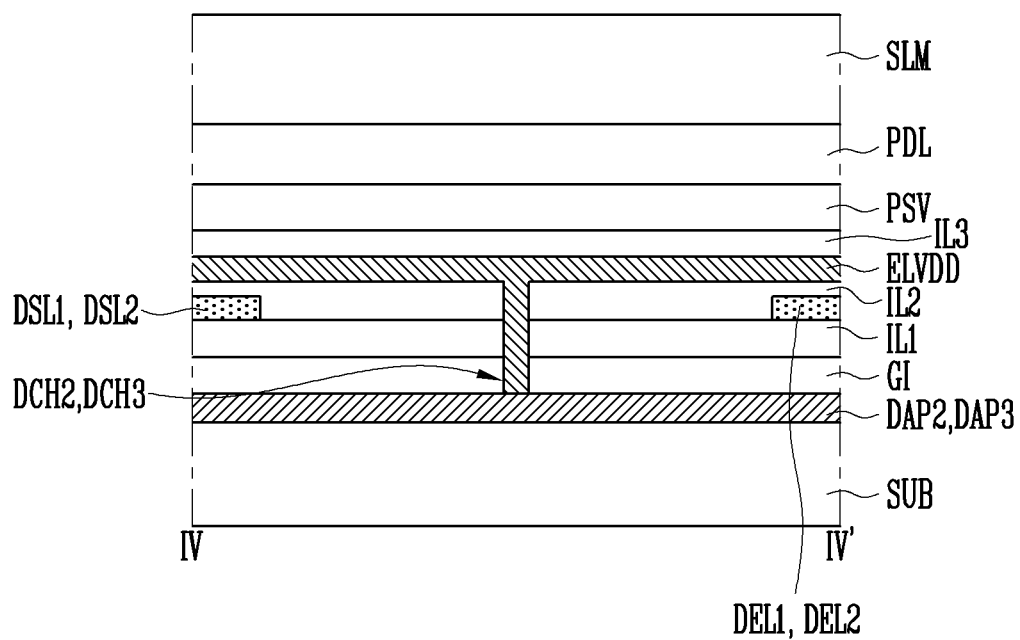
FIG. 14 is a sectional view taken along the line IV-IV' of FIG. 12.

FIG. 8 is a plan view illustrating a display device according to an embodiment of the present disclosure, which illustrates a display device having dummy parts provided in a peripheral region. FIGS. 9 to 11 are enlarged views of the region EA1 shown in FIG. 8. FIG. 12 is an enlarged view of the region EA2 or the region EA3 shown in FIG. 8. FIG. 13 is a sectional view taken along the line III-III' of FIG. 9. FIG. 14 is a sectional view taken along the line IV-IV' of FIG. 12.

Referring to FIGS. 8 to 13, the second display region PXA2 and the third display region PXA3 may include sub-regions SA1, SA2, SA3, and SA4. For example, the second display region PXA2 may include a first sub-region SA1 and a second sub-region SA2. One of the first sub-region SA1 and the second sub-region SA2, for example, the first sub-region SA1 may be a region adjacent to the first display region PXA1, and the other of the first sub-region SA1 and the second sub-region SA2, for example, the second sub-region SA2 may be a region spaced apart from the first display region PXA1. In addition, the third display region PXA3 may include a third sub-region SA3 and a fourth sub-region SA4. One of the third sub-region SA3 and the fourth sub-region SA4, for example, the third sub-region SA3 may be a region adjacent to the first display region PXA1, and the other of the third sub-region SA3 and the fourth sub-region SA4, for example, the fourth sub-region SA4 may be a region spaced apart from the first display region PXA1. As shown in FIG. 8, each of the second sub-region SA2 and the fourth sub-region SA4 has a shape with a decreasing width further away from the first display region PXA1.

Load values (i.e., impedance values) of scan lines connected to the second and third pixels PXL2 and PXL3 of the second and third regions A2 and A3 and the first pixel PXL1 of the first region A1 may be different. This is because the number of pixels and the length of scan lines in the second and third regions A2 and A3 are different from the number of pixels and the length of scan lines in the first region μl. In particular, the load value of the scan lines in the first region A1 may be greater than that of the scan lines in the second and third regions A2 and A3.

In an embodiment of the present disclosure, in order to compensate for a difference in load value according to display regions, a structure in which parasitic capacitances are different for every display region may be applied using dummy parts. That is, in order to compensate for a difference in load value between the first display region PXA1 and the second and third display regions PXA2 and PXA3, any dummy part is not connected to the first pixels PXL1 of the first display region PXA1, and the second pixels PXL2 of the second display region PXA2 and the third pixels PXL3 of the third display region PXA3 may be connected to dummy parts DMP1, DMP2, and DMP3.

The dummy parts DMP1, DMP2, and DMP3 may include a first dummy part DMP1, a second dummy part DMP2, and a third dummy part DMP3.

The first dummy part DMP1 may be connected to second pixels PXL2 provided in the first sub-region SA1 of the second display region PXA2 and third pixels PXL3 provided in the third sub-region SA3 of the third display region PXA3. That is, the first dummy part DMP1 may be shared by the second pixels PXL2 of the first sub-region SA1 and the third pixels PXL3 of the third sub-region SA3. The first dummy part DMP1 may be provided in the additional peripheral region APA that connects the second peripheral region PPA2 and the third peripheral region PPA3.

In an embodiment of the present disclosure, at least one scan line connection part ES that connects second scan lines S2p–1 and S2p of the first sub-region SA1 and third scan lines S3q–1 and S3q, which are disposed on the same row, may be provided in the additional peripheral region APA. For example, as shown in FIG. 8, a plurality of scan line connection parts ES that respectively connect the second scan lines S2p–1 and S2p of the first sub-region SA1 and the third scan lines S3q–1 and S3q may be provided in the additional peripheral region APA.

Similarly, at least one emission control line connection part EE that connects second emission control lines E2p–1 and E2p and third emission control lines E3q–1 and E3q of the first sub-region SA1 and the third sub-region SA3, which are disposed on the same row, may be provided in the additional peripheral region APA.

In an embodiment of the present disclosure, the first dummy part DMP1 may be provided in a region in which the scan line connecting parts ES or the emission control line connection parts EE overlap with the power supply unit. The power supply unit may be one of the first power supply line ELVDD and the second power supply line ELVSS. Hereinafter, for convenience of illustration, a case where the first dummy part DMP1 is provided in a region in which the scan line connecting parts ES or the emission control line connection parts EE overlap with the first power supply line ELVDD is described as an example.

The scan line connection parts ES and the emission control line connection parts EE may be formed of the same material using the same process as the initialization power line IPL and the upper electrode UE of the storage capacitor Cst.

In an embodiment of the present disclosure, a case where the scan line connection parts ES and the emission control line connection parts EE are formed in the same layer as the initialization power line IPL and the upper electrode UE is described as an example, but the present disclosure is not limited thereto. For example, the scan line connection parts ES and the emission control line connection parts EE may be formed in the same layer as the second scan lines S2p–1 and S2p and the second emission control lines E2p–1 and E2p of the first sub-region SA1. In addition, the scan line connection parts ES and the emission control line connection parts EE may be formed in the same layer as the third scan lines S3q–1 and S3q and the third emission control lines E3q–1 and E3q of the third sub-region SA3.

In the first dummy part DMP1, a portion of the first power supply line ELVDD may overlap with the scan line connection parts ES and the emission control line connection parts EE, thereby forming a first parasitic capacitor.

A first parasitic capacitance of the first parasitic capacitor may compensate for load values of the second scan lines S2p–1 and S2p of the first sub-region SA1 and the third scan lines S3q–1 and S3q of the third sub-region SA3 by increasing loads of the second scan lines S2p–1 and S2p of the first sub-region SA1 and the third scan lines S3q–1 and S3q of the third sub-region SA3. As a result, the load values of the second scan lines S2p–1 and S2p of the first sub-region SA1 and the third scan lines S3q–1 and S3q of the third sub-region SA3 may be equal or similar to that of the first scan lines S11 to S1n of the first display region PXA1.

In an embodiment of the present disclosure, the first parasitic capacitance of the first parasitic capacitor formed by the first dummy part DMP1 may be differently set according to a load value of scan lines to be compensated.

Similarly, the first dummy part DMP1 may compensate for load values of the second emission control lines E2p–1 and E2p of the first sub-region SA1 and the third emission control lines E3q–1 and E3q of the third sub-region SA3. For example, the first parasitic capacitance of the first parasitic capacitor may compensate for the load values of the second emission control lines E2p–1 and E2p of the first sub-region SA1 and the third emission control lines E3q–1 and E3q of the third sub-region SA3 by increasing loads of the second emission control lines E2p−1 and E2p of the first sub-region SA1 and the third emission control lines E3q−1 and E3q of the third sub-region SA3. As a result, the load values of the second emission control lines E2p−1 and E2p of the first sub-region SA1 and the third emission control lines E3q−1 and E3q of the third sub-region SA3 may be equal or similar to that of the first emission control lines E11 to E1n of the first display region PXA1.

In an embodiment of the present disclosure, in the first sub-region SA1, the length of second scan lines S21 to S2p disposed on a row having a small number of second pixels PXL2 may be shorter than that of second scan lines S21 to S2p disposed on a row having a large number of second pixels PXL2. In addition, in the third sub-region SA3, the length of third scan lines S31 to S3q disposed on a row having a small number of third pixels PXL3 may be shorter than that of third scan lines S31 to S3q disposed on a row having a large number of third pixels PXL3. The length of a scan line connection part ES connected to a second scan line S21 to S2p and a third scan line S31 to S3q, of which length is short, from among the scan line connection parts ES may be longer than that of a scan line connection part ES connected to a second scan line S21 to S2p and a third scan line S31 to S3q, of which length is long, from among the scan line connection parts ES.

Because the first dummy part DMP1 is provided in the region in which the first power supply line ELVDD and the scan line connection parts ES overlap with each other, the overlapping area of scan line connection parts ES of which length is long and the first power supply line ELVDD may be larger than that of scan line connection parts ES of which length is short and the first power supply line ELVDD.

The first parasitic capacitance of a first parasitic capacitor formed by overlapping of the scan line connection parts ES of which length is long and the first power supply line ELVDD may be greater than that of a first parasitic capacitor formed by overlapping of the scan line connection parts ES of which length is short and the first power supply line ELVDD. Therefore, in the first sub-region SA1 and the third sub-region SA3, the load value of a second scan line S21 to S2p or third scan line S31 to S3q disposed on a row having a small number of pixels may be equal or similar to that of a second scan line S21 to S2p or third scan line S31 to S3q disposed on a row having a large number of pixels.

The first parasitic capacitance of the first parasitic capacitor may be differently set according to load values of second scan lines S21 to S2p and third scan lines S31 to S3q to be compensated, and a difference in load value may be compensated by changing the overlapping area of the first power supply line ELVDD and the scan line connection parts ES.

Similarly, a difference in load value between the second emission control lines E21 to E2p and the third emission control lines E31 to E3q may also be compensated by changing the overlapping area of the first power supply line ELVDD and the emission control line connection parts EE.

In an embodiment of the present disclosure, a first dummy pattern DAP1 may be further provided in the first dummy part DMP1. The first dummy pattern DAP1 may be formed of the same material using the same process as the first to seventh active patterns ACT1 to ACT7, the first to seventh source electrodes SE1 to SE7, and the first to seventh drain electrode DE1 to DE7 of the second pixels PXL2 and the third pixels PXL3. That is, the first dummy pattern DAP1 may be provided on the same layer as the first to seventh active patterns ACT1 to ACT7, the first to seventh source electrodes SE1 to SE7, and the first to seventh drain electrode DE1 to DE7 of the second pixels PXL2 and the third pixels PXL3.

In addition, the first dummy pattern DAP1 may overlap with the scan line connection parts ES and the emission control line connection parts EE. The first dummy pattern DAP1 may be electrically connected to the first power supply line ELVDD through a first dummy contact hole (e.g., a first dummy contact opening) DCH1. The first dummy contact hole DCH1 may pass through the gate insulating layer GI, the first interlayer insulating layer IL1, and the second interlayer insulating layer IL2.

In the first dummy part DMP1, at least one of the first power supply line ELVDD and the first dummy pattern DAP1 may form the first parasitic capacitor by overlapping with the scan line connection parts ES and the emission control line connection parts EE. For example, both of the first power supply line ELVDD and the first dummy pattern DAP1 may form the first parasitic capacitor by overlapping with the scan line connection parts ES and the emission control line connection parts EE. That is, the first parasitic capacitor may include a (1-1)th parasitic capacitor formed by the scan line connection parts ES and emission control line connection parts EE and the first power supply line ELVDD, and a (1-2)th parasitic capacitor formed by the scan line connection parts ES and emission control line connection parts EE and the first dummy pattern DAP1.

In an embodiment of the present disclosure, a case where both of the first power supply line ELVDD and the first dummy pattern DAP1 forms the first parasitic capacitor by overlapping with the scan line connection parts ES and the emission control line connection parts EE is described as an example, but the present disclosure is not limited thereto. For example, when both of the first power supply line ELVDD and the first dummy pattern DAP1 do not overlap with the scan line connection parts ES and the emission control line connection parts EE, the scan line connection parts ES and the emission control line connection parts EE may form the first parasitic capacitor by overlapping with the first dummy pattern DAP1.

The second dummy part DMP2 may be connected to the second pixels PXL2 provided in the second sub-region SA2 of the second display region PXA2. The second dummy part DMP2 may be provided in the second peripheral region PPA2 corresponding to the second sub-region SA2. For example, the second dummy part DMP2 may be provided at the lateral part of the second peripheral region PPA2.

In an embodiment of the present disclosure, at least one first dummy scan line DSL1 connected to second scan lines S21 and S22 of the second sub-region SA2 may be provided in the second peripheral region PPA2. For example, a plurality of first dummy scan lines DSL1 connected to the second scan lines S21 and S22 of the second sub-region SA2 may be provided in the second peripheral region PPA2.

Similarly, at least one first dummy emission control line DEL1 connected to second emission control lines E21 and E22 of the second sub-region SA2 may be provided in the second peripheral region PPA2. For example, a plurality of first dummy emission control lines DEL1 connected to the second emission control lines E21 and E22 of the second sub-region SA2 may be provided in the second peripheral region PPA2.

In an embodiment of the present disclosure, the second dummy part DMP2 may be provided in a region in which the first dummy scan lines DSL1 or the first dummy emission control lines DEL1 overlap with the power supply unit, for example, a portion of the first power supply line ELVDD.

The first dummy scan lines DSL1 and the first dummy emission control lines DEL1 may be formed of the same material using the same process as the initialization power line IPL and the upper electrode UE of the storage capacitor Cst.

In an embodiment of the present disclosure, a case where the first dummy scan lines DSL1 and the first dummy emission control lines DEL1 are formed in the same layer as the initialization power line IPL and the upper electrode UE is described as an example, but the present disclosure is not limited thereto. For example, the first dummy scan lines DSL1 and the first dummy emission control lines DEL1 may be formed in the same layer as the second scan lines S21 to S2$p$ and the second emission control lines E21 to E2$p$.

In the second dummy part DMP2, a portion of the first power supply line ELVDD may form a second parasitic capacitor by overlapping with the first dummy scan lines DSL1 and the first dummy emission control lines DEL1.

The second parasitic capacitance of the second parasitic capacitor may compensate for a load value of second scan lines S21 and S22 of the second sub-region SA2 by increasing a load of the second scan lines S21 and S22 of the second sub-region SA2. As a result, the load value of the second scan lines S21 and S22 of the second sub-region SA2 may be equal or similar to that of the first scan lines S11 to S1$n$ of the first display region PXA1.

In an embodiment of the present disclosure, the second parasitic capacitance of the second parasitic capacitor formed by the second dummy part DMP2 may be differently set according to a load value of scan lines to be compensated.

Similarly, the second dummy part DMP2 may compensate for a load value of second emission control lines E21 and E22 of the second sub-region SA2. For example, the second parasitic capacitance of the second parasitic capacitor may compensate for the load value of second emission control lines E21 and E22 of the second sub-region SA2 by increasing a load of the second emission control lines E21 and E22 of the second sub-region SA2. As a result, the load value of second emission control lines E21 and E22 of the second sub-region SA2 may be equal or similar to that of the first emission control lines E11 to E1$n$ of the first display region PXA1.

In an embodiment of the present disclosure, a second dummy pattern DAP2 may be further provided in the second dummy part DMP2. The second dummy pattern DAP2 may be formed of the same material using the same process as the first to seventh active patterns ACT1 to ACT7, the first to seventh source electrodes SE1 to SE7, and the first to seventh drain electrode DE1 to DE7 of the second pixels PXL2. That is, the second dummy pattern DAP2 may be provided on the same layer as the first to seventh active patterns ACT1 to ACT7, the first to seventh source electrodes SE1 to SE7, and the first to seventh drain electrode DE1 to DE7 of the second pixels PXL2.

In addition, the second dummy pattern DAP2 may overlap with the first dummy scan lines DSL1 and the first dummy emission control lines DEL1. The second dummy pattern DAP2 may be electrically connected to the first power supply line ELVDD through a second dummy contact hole (e.g., a second dummy contact opening) DCH2. The second dummy contact hole DCH2 may pass through the gate insulating layer GI, the first interlayer insulating layer IL1, and the second interlayer insulating layer IL2.

In the second dummy part DMP2, at least one of the first power supply line ELVDD and the second dummy pattern DAP2 may form the second parasitic capacitor by overlapping with the first dummy scan line DSL1 and the first dummy emission control line DEL1. For example, both of the first power supply line ELVDD and the second dummy pattern DAP2 may form the second parasitic capacitor by overlapping with the first dummy scan line DSL1 and the first dummy emission control line DEL1. That is, the second parasitic capacitor may include a (2-1)th parasitic capacitor formed by the first dummy scan line DSL1 and first dummy emission control line DEL1 and the first power supply line ELVDD, and a (2-2)th parasitic capacitor formed by the first dummy scan line DSL1 and first dummy emission control line DEL1 and the second dummy pattern DAP2.

In an embodiment of the present disclosure, a case where both of the first power supply line ELVDD and the second dummy pattern DAP2 form the second parasitic capacitor by overlapping with the first dummy scan line DSL1 and the first dummy emission control line DEL1 is described as an example, but the present disclosure is not limited. For example, when both of the first power supply line ELVDD and the second dummy pattern DAP2 do not overlap with the first dummy scan line DSL1 and the first dummy emission control line DEL1, the first dummy scan line DSL1 and the first dummy emission control line DEL1 may form the second parasitic capacitor by overlapping with the second dummy pattern DAP2.

In an embodiment of the present disclosure, in order to compensate for a difference in load value between the first scan lines S11 to S1$n$ and the first emission control lines E11 to E1$n$ of the first display region PXA1 and the third scan lines S31 and S32 and the third emission control lines E31 and E32 in the fourth sub-region SA4, the dummy parts DMP1, DMP2, and DMP3 are not provided in the first peripheral region PPA1 corresponding to the first display region PXA1, and the third dummy part DMP3 may be provided in the third peripheral region PPA3 corresponding to the fourth sub-region SA4. The third dummy part DMP3 may be connected to the third pixels PXL3 provided in the fourth sub-region SA4 of the third display region PXA3. The third dummy part DMP3 may be provided in the third peripheral region PPA3 corresponding to the fourth sub-region SA4. For example, the third dummy part DMP3 may be provided at the lateral part of the third peripheral region PPA3.

In an embodiment of the present disclosure, at least one second dummy scan line DSL2 connected to the third scan lines S31 and S32 of the fourth sub-region SA4 may be provided in the third peripheral region PPA3. For example, a plurality of second dummy scan lines DSL2 connected to the third scan lines S31 and S32 of the fourth sub-region SA4 may be provided in the third peripheral region PPA3.

Similarly, at least one second dummy emission control line DEL2 connected to the third emission control lines E31 and E32 of the fourth sub-region SA4 may be provided in the third peripheral region PPA3. For example, a plurality of second dummy emission control lines DEL2 connected to the third emission control lines E31 and E32 of the fourth sub-region SA4 may be provided in the third peripheral region PPA3.

In an embodiment of the present disclosure, the third dummy part DMP3 may be provided in a region in which the second dummy scan lines DSL2 or the second dummy emission control lines DEL2 overlap with the power supply unit, for example, a portion of the first power supply line ELVDD. The second dummy scan lines DSL2 and the second dummy emission control lines DEL2 may be formed of the same material using the same process as the initialization power line IPL and the upper electrode UE of the storage capacitor Cst.

In an embodiment of the present disclosure, a case where the second dummy scan lines DSL2 and the second dummy emission control lines DEL2 are formed in the same layer as the initialization power line IPL and the upper electrode UE is described as an example, but the present disclosure is not limited thereto. For example, the second dummy scan lines DSL2 and the second dummy emission control lines DEL2 may be formed of the same material using the same process as the third scan lines S31 to S3q and the third emission control lines E31 to E3q.

In the third dummy part DMP3, a portion of the first power supply line ELVDD may form a third parasitic capacitor by overlapping with the second dummy scan lines DSL2 and the second dummy emission control lines DEL2.

The third parasitic capacitance of the third parasitic capacitor may compensate for a load value of the third scan lines S31 and S32 of the fourth sub-region SA4 by increasing a load of the third scan lines S31 and S32 of the fourth sub-region SA4. As a result, the load value of the third scan lines S31 and S32 of the fourth sub-region SA4 may be equal or similar to that of the first scan lines S11 to S1n of the first display region PXA1.

In an embodiment of the present disclosure, the third parasitic capacitance of the third parasitic capacitor formed by the third dummy part DMP3 may be differently set according to a load value of scan lines to be compensated.

Similarly, the third dummy part DMP3 may compensate for a load value of the third emission control lines E31 and E32 of the fourth sub-region SA4. For example, the third parasitic capacitance of the third parasitic capacitor may compensate for the load value of the third emission control lines E31 and E32 of the fourth sub-region SA4 by increasing a load of the third emission control lines E31 and E32 of the fourth sub-region SA4. As a result, the load value of the third emission control lines E31 and E32 of the fourth sub-region SA4 may be equal to similar to that of the first emission control lines E11 to E1n of the first display region PXA1.

In an embodiment of the present disclosure, a third dummy pattern DAP3 may be further provided in the third dummy part DMP3. The third dummy pattern DAP3 may be formed of the same material using the same process as the first to seventh active patterns ACT1 to ACT7, the first to seventh source electrodes SE1 to SE7, and the first to seventh drain electrode DE1 to DE7 of the third pixels PXL3. That is, the third dummy pattern DAP3 may be provided on the same layer as the first to seventh active patterns ACT1 to ACT7, the first to seventh source electrodes SE1 to SE7, and the first to seventh drain electrode DE1 to DE7 of the third pixels PXL3.

In addition, the third dummy pattern DAP3 may overlap with the second dummy scan lines DSL2 and the second dummy emission control lines DEL2. The third dummy pattern DAP3 may be electrically connected to the first power supply line ELVDD through a third dummy contact hole (e.g., a third dummy contact opening) DCH3. The third dummy contact hole DCH3 may pass through the gate insulating layer GI, the first interlayer insulating layer IL1, and the second interlayer insulating layer IL2.

In the third dummy part DMP3, at least one of the first power supply line ELVDD and the third dummy pattern DAP3 may form the third parasitic capacitor by overlapping with the second dummy scan line DSL2 and the second dummy emission control line DEL2. For example, both of the first power supply line ELVDD and the third dummy pattern DAP3 may form the third parasitic capacitor by overlapping with the second dummy scan line DSL2 and the second dummy emission control line DEL2. That is, the third parasitic capacitor may include a (3-1)th parasitic capacitor formed by the second dummy scan line DSL2 and second dummy emission control line DEL2 and the first power supply line ELVDD, and a (3-2)th parasitic capacitor formed by the second dummy scan line DSL2 and second dummy emission control line DEL2 and the third dummy pattern DAP3.

In an embodiment of the present disclosure, a case where both of the first power supply line ELVDD and the third dummy pattern DAP3 form the third parasitic capacitor by overlapping with the second dummy scan line DSL2 and the second dummy emission control line DEL2 is described as an example, but the present disclosure is not limited thereto. For example, when both of the first power supply line ELVDD and the third dummy pattern DAP3 do not overlap with the second dummy scan line DSL2 and the second dummy emission control line DEL2, the second dummy scan line DSL2 and the second dummy emission control line DEL2 may form the third parasitic capacitor by overlapping with the third dummy pattern DAP3.

Figure 15:
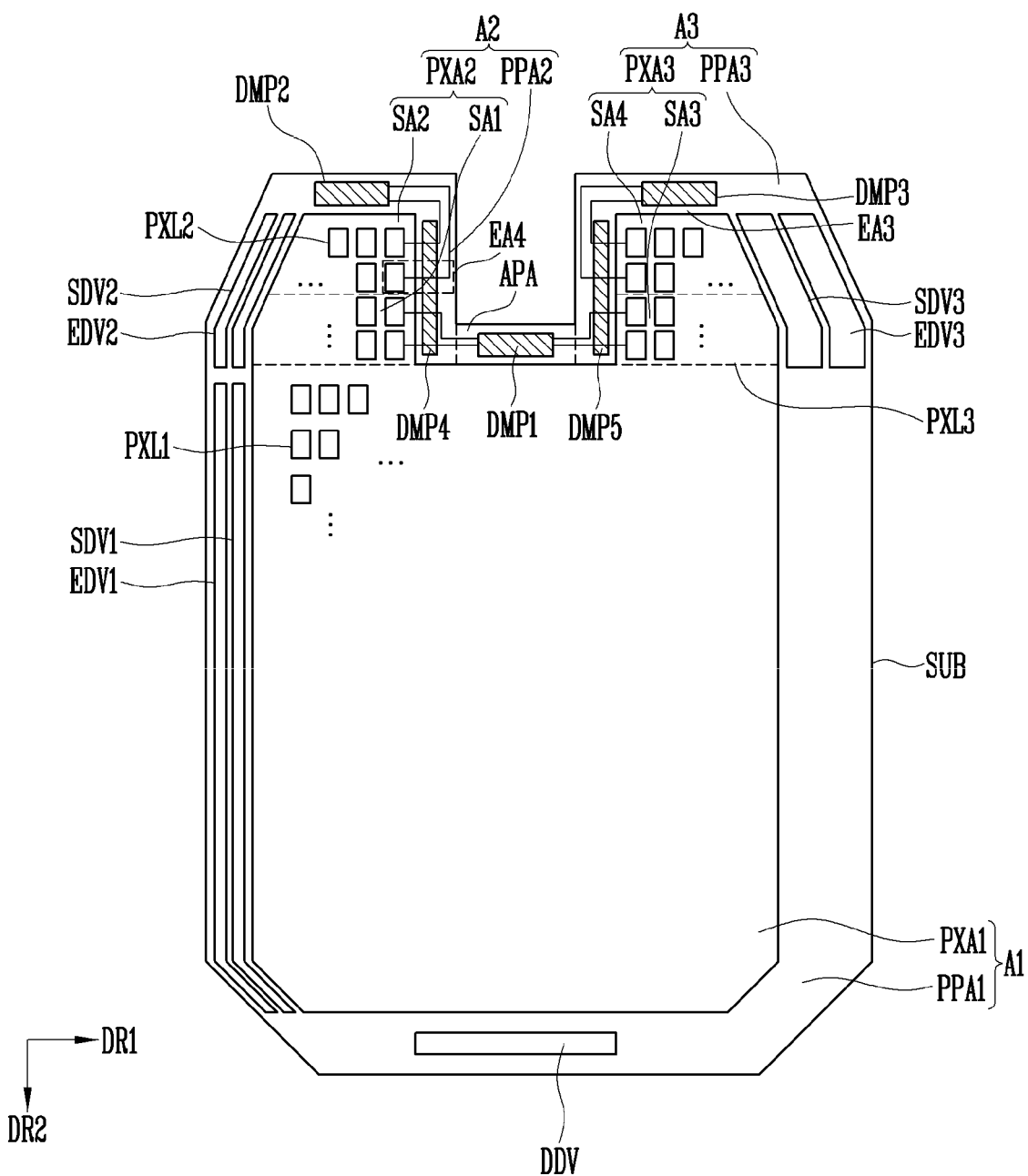
FIG. 15 is a plan view illustrating a display device according to an embodiment of the present disclosure.
Figure 16:
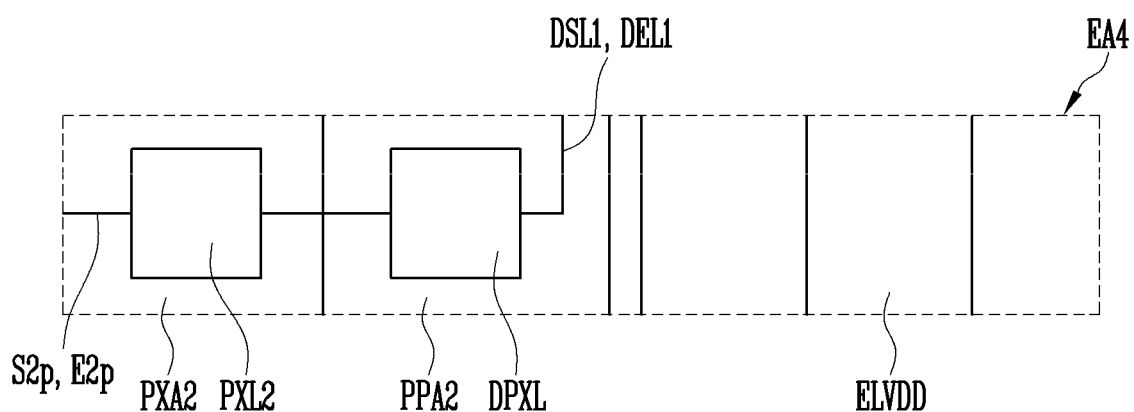
FIG. 16 is an enlarged view of the region EA4 shown in FIG. 15.
Figure 17:
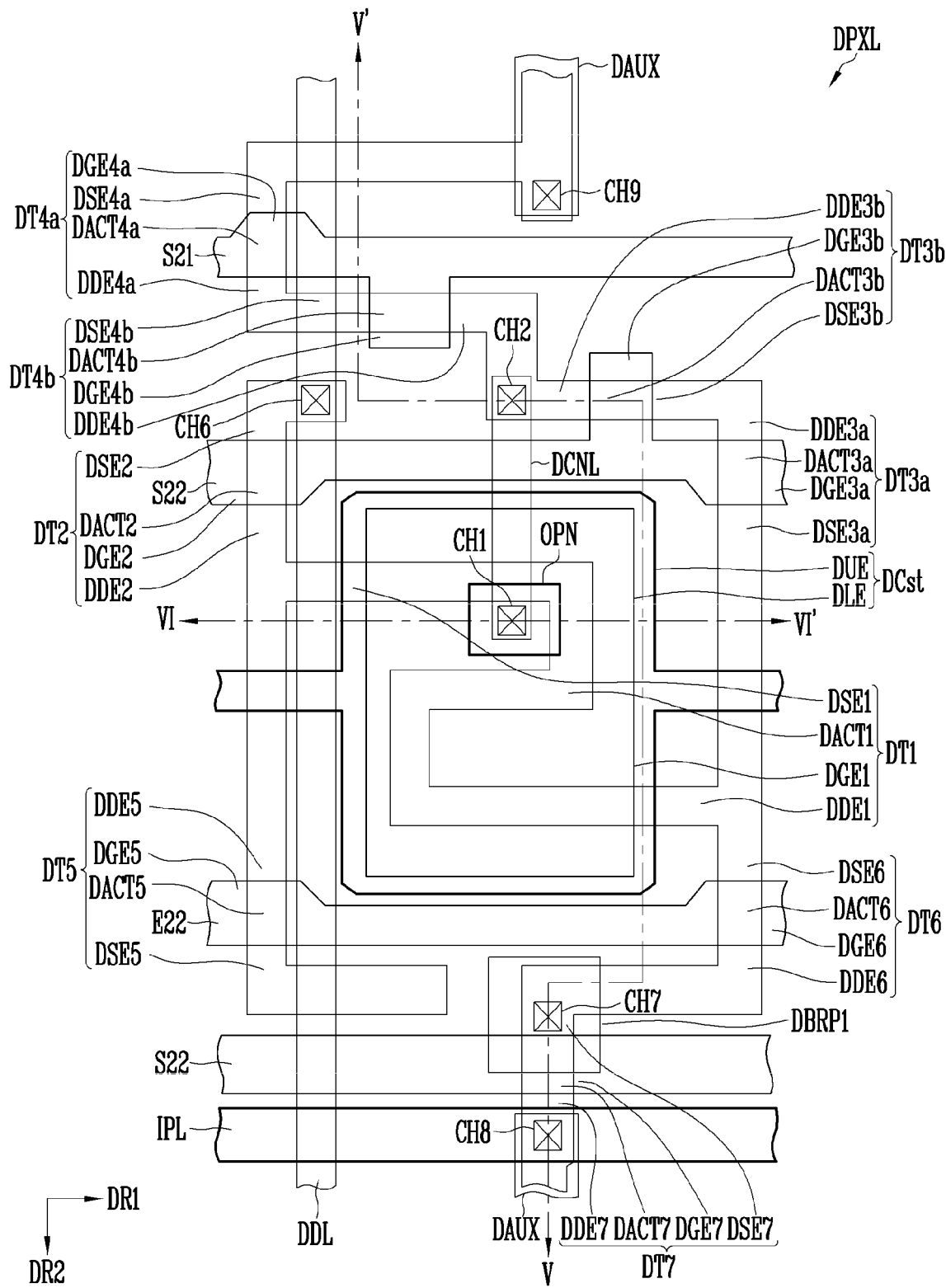
FIG. 17 is a plan view illustrating a dummy pixel shown in FIG. 16.
Figure 18:
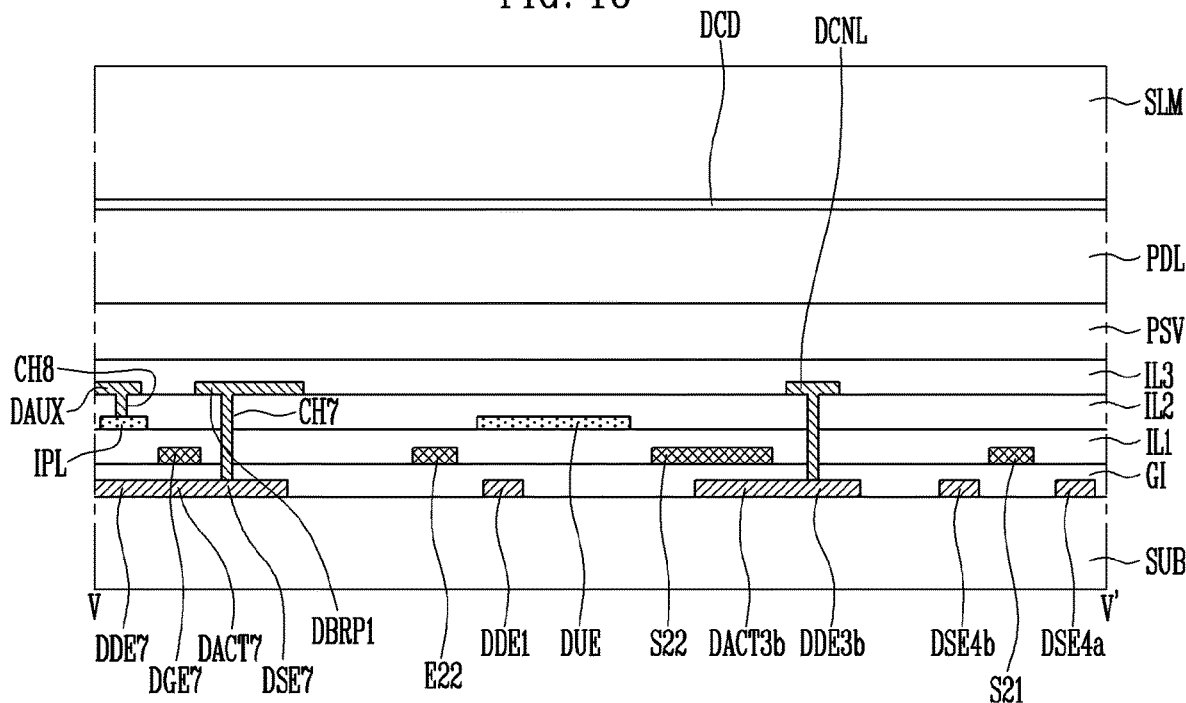
FIG. 18 is a sectional view taken along the line V-V' of FIG. 17.
Figure 19:
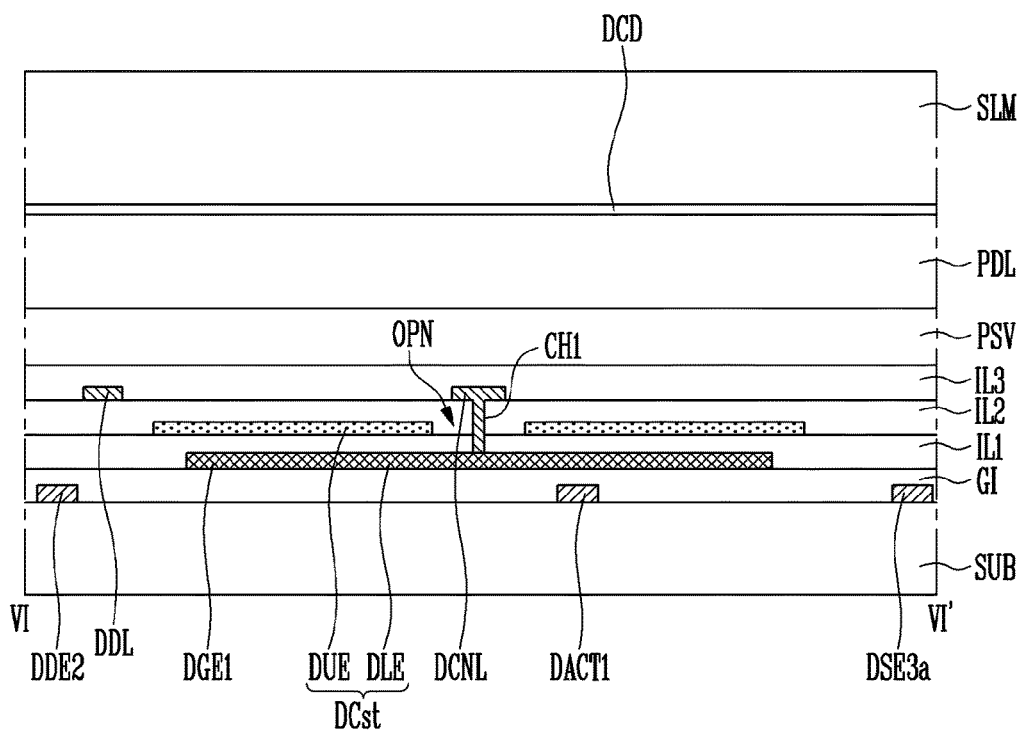
FIG. 19 is a sectional view taken along the line VI-VI' of FIG. 17.

FIG. 15 is a plan view illustrating a display device according to an embodiment of the present disclosure. FIG. 16 is an enlarged view of the region EA4 shown in FIG. 15. FIG. 17 is a plan view illustrating a dummy pixel shown in FIG. 16. FIG. 18 is a sectional view taken along the line V-V of FIG. 17. FIG. 19 is a sectional view taken along the line VI-VI' of FIG. 17. For convenience of description, a second pixel and a dummy pixel, which are connected to a second scan line is illustrated in FIGS. 16 and 17.

Referring to FIGS. 15 to 19, the second display region PXA2 and the third display region PXA3 may include sub-regions SA1, SA2, SA3, and SA4. For example, the second display region PXA2 may include a first sub-region SA1 and a second sub-region SA2. One of the first sub-region SA1 and the second sub-region SA2, for example, the first sub-region SA1 may be a region adjacent to the first display region PXA1, and the other of the first sub-region SA1 and the second sub-region SA2, for example, the second sub-region SA2 may be a region spaced apart from the first display region PXA1. In addition, the third display region PXA3 may include a third sub-region SA3 and a fourth sub-region SA4. One of the third sub-region SA3 and the fourth sub-region SA4, for example, the third sub-region SA3 may be a region adjacent to the first display region PXA1, and the other of the third sub-region SA3 and the fourth sub-region SA4, for example, the fourth sub-region SA4 may be a region spaced apart from the first display region PXA1.

Load values of scan lines connected to the second and third pixels PXL2 and PXL3 of the second and third regions A2 and A3 may be different from load values of scan lines connected to the first pixel PXL1 of the first region A1. This is because the number of pixels and the length of scan lines in the second and third regions A2 and A3 are different from the number of pixels and the length of scan lines in the first region A1. In particular, the load value of the scan lines in the first region A1 may be greater than that of the scan lines in the second and third regions A2 and A3.

In an embodiment of the present disclosure, in order to compensate for a difference in load value according to display regions, a structure in which parasitic capacitances are different for every display region may be applied using dummy parts. That is, in order to compensate for a difference in load value between the first display region PXA1 and the second and third display regions PXA2 and PXA3, any dummy part is not connected to the first pixels PXL1 of the first display region PXA1, and the second pixels PXL2 of the second display region PXA2 and the third pixels PXL3 of the third display region PXA3 may be connected to dummy parts DMP1, DMP2, DMP3, DMP4, and DMP5.

The dummy parts DMP1, DMP2, DMP3, DMP4, and DMP5 may include a first dummy part DMP1, a second dummy part DMP2, a third dummy part DMP3, a fourth dummy part DMP4 and a fifth dummy part DMP5.

The first dummy part DMP1, the second dummy part DMP2, and the third dummy part DMP3 are identical to the first dummy part DMP1, the second dummy part DMP2, and the third dummy part DMP3, which are shown in FIGS. 8 to 14, and therefore, will be briefly described.

The first dummy part DMP1 may be connected to second pixels PXL2 provided in the first sub-region SA1 of the second display region PXA2 and third pixels PXL3 provided in the third sub-region SA3 of the third display region PXA3. That is, the first dummy part DMP1 may be shared by the second pixels PXL2 of the first sub-region SA1 and the third pixels PXL3 of the third sub-region SA3. In the additional peripheral region APA that connects the second peripheral region PPA2 and the third peripheral region PPA3, the first dummy part DMP1 may be provided in a region in which the scan line connection parts ES or the emission control line connection parts EE overlap with the first power supply line ELVDD.

The first dummy part DMP1 may compensate for load values of second scan lines S2$p$–1 and S2$p$ of the first sub-region SA1 and third scan lines S3$q$–1 and S3$q$ of the third sub-region SA3 by increasing loads of the second scan lines S2$p$–1 and S2$p$ of the first sub-region SA1 and the third scan lines S3$q$–1 and S3$q$ of the third sub-region SA3. In addition, the first dummy part DMP1 may compensate for load values of second emission control lines E2$p$–1 and E2$p$ of the first sub-region SA1 and third emission control lines E3$q$–1 and E3$q$ of the third sub-region SA3.

The second dummy part DMP2 may be connected to second pixels PXL2 provided in the second sub-region SA2. The second dummy part DMP2 may be provided in the second peripheral region PPA2 corresponding to the second sub-region SA2.

The second dummy part DMP2 may compensate for load values of second scan lines S21 and S22 and second emission control lines E21 and E22 of the second sub-region SA2 by increasing loads of the second scan lines S21 and S22 and the second emission control lines E21 and E22 of the second sub-region SA2.

The third dummy part DMP3 may be connected to third pixels PXL3 provided in the fourth sub-region SA4 of the third display region PXA3. The third dummy part DMP3 may be provided in the third peripheral region PPA3 corresponding to the fourth sub-region SA4.

The third dummy part DMP3 may compensate for load values of third scan lines S31 and S32 and third emission control lines E31 and E32 of the fourth sub-region SA4 by increasing loads of the third scan lines S31 and S32 and the third emission control lines E31 and E32 of the fourth sub-region SA4.

The fourth dummy part DMP4 may be disposed at the longitudinal part of the second peripheral region PPA2, which is adjacent to a longitudinal side of the second display region PXA2. For example, in the second peripheral region PPA2, the fourth dummy part DMP4 may be provided between the second display region PXA2 and the first dummy part DMP1.

The fourth dummy part DMP4 may be connected to the second scan lines S21 to S2$p$ and the second emission control lines E21 to E2$p$. The fourth dummy part DMP4 may be electrically connected to the first dummy part DMP1 and the second dummy part DMP2.

The fourth dummy part DMP4 may include a plurality of dummy pixels DPXL. The dummy pixels DPXL may have a structure similar to that of the second pixel PXL2 provided in the second display region PXA2. However, the dummy pixels DPXL may have a structure the power line PL, the second bridge pattern BRP2, and the first electrode AD of the second pixels PXL2 are omitted. As shown in FIG. 16, at least one dummy pixel DPXL of the fourth dummy part DMP4 may be connected to the second scan lines S2$p$ and the second emission control lines E2$p$, and may be connected to the first dummy scan lines DSL1 and the first dummy emission control lines DEL1.

Hereinafter, a dummy pixel DPXL connected to the second second scan line S22 is described as an example.

The dummy pixel DPXL may be connected to the second second scan line S22 and the second second emission control line E22. The dummy pixel DPXL may include a dummy data line DDL crossing the second second scan line S22 and the second second emission control line E22, at least one dummy transistor DT1, DT2, DT3, DT4, DT5, DT6, and DT7 electrically connected to the second second scan line S22 and the dummy data line DDL, and a dummy storage capacitor DCst.

In an embodiment of the present disclosure, the dummy pixel DPXL may include first to seventh dummy transistors DT1, DT2, DT3, DT4, DT5, DT6, and DT7. The first to seventh dummy transistors DT1, DT2, DT3, DT4, DT5, DT6, and DT7 may have a form similar or identical to that of the first to seventh transistors T1, T2, T3, T4, T5, T6, and T7 of the second pixel PXL2. For example, each of the first to seventh dummy transistors DT1, DT2, DT3, DT4, DT5, DT6, and DT7 may include a dummy gate electrode, a dummy active pattern, a dummy source electrode, and a dummy drain electrode.

The first dummy transistor DT1 may include a first dummy gate electrode DGE1, a first dummy active pattern DACT1, a first dummy source electrode DSE1, and a first dummy drain electrode DDE1.

The first dummy gate electrode DGE1 may be connected to a third dummy drain electrode DDE3 of the third dummy transistor DT3 and a fourth dummy drain electrode DDE4 of the fourth dummy transistor DT4. The dummy connection line DCNL may connect between the first dummy gate electrode DGE1 and the third and fourth dummy drain electrodes DDE3 and DDE4. One end of the dummy connection line DCNL may be connected to the first dummy gate electrode DGE1 through a first contact hole CH1, and the other end of the dummy connection line DCNL may be connected to the third and fourth dummy drain electrodes DDE3 and DDE4 through a second contact hole CH2.

The first dummy active pattern DACT1, the first dummy source electrode DSE1, and the first dummy drain electrode DDE1 may be formed of a semiconductor layer undoped or doped with impurities. For example, the first dummy source electrode DSE1 and the first dummy drain electrode DDE1 may be formed of a semiconductor layer doped with impurities, and the first dummy active pattern DACT1 may be formed of a semiconductor layer undoped with impurities. The first dummy source electrode DSE1 may be connected to one end of the first dummy active pattern DACT1. The first dummy source electrode DSE1 may be connected to a second dummy drain electrode DDE2 of the second dummy transistor DT2 and a fifth dummy drain electrode DDE5 of the fifth dummy transistor DT5. The first dummy drain electrode DDE1 may be connected to the other end of the first dummy active pattern DACT1. The first dummy drain electrode DDE1 may be connected to a third dummy source electrode DSE3 of the third dummy transistor DT3 and a sixth dummy source electrode DSE6 of the sixth dummy transistor DT6.

The second dummy transistor DT2 may include a second dummy gate electrode DGE2, a second dummy active pattern DACT2, a second dummy source electrode DSE2, and the second dummy drain electrode DDE2.

The second dummy gate electrode DGE2 may be connected to the second second scan line S22. The second dummy gate electrode DGE2 may be provided as a portion of the second second scan line S22 or may be provided in a shape protruding from the second second scan line S22.

The second dummy active pattern DACT2, the second dummy source electrode DSE2, and the second dummy drain electrode DDE2 may be formed of a semiconductor undoped or doped with impurities. For example, the second dummy source electrode DSE2 and the second dummy drain electrode DDE2 may be formed of a semiconductor doped with impurities, and the second dummy active pattern DACT2 may be formed of a semiconductor layer undoped with impurities. The second dummy active pattern DACT2 may correspond to a portion overlapping with the second dummy gate electrode DGE2. One end of the second dummy source electrode DSE2 may be connected to the second dummy active pattern DACT2. The other end of the second dummy source electrode DSE2 may be connected to the dummy data line DDL through a sixth contact hole CH6. One end of the second dummy drain electrode DDE2 may be connected to the second dummy active pattern DACT2. The other end of the second dummy drain electrode DDE2 may be connected to the first dummy source electrode DSE1 of the first dummy transistor DT1 and the fifth dummy drain electrode DDE5 of the fifth dummy transistor DT5.

The third dummy transistor DT3 may be provided in a double gate structure so as to prevent or substantially reduce a leakage current. That is, the third dummy transistor DT3 may include a 3ath dummy transistor DT3*a* and a 3bth dummy transistor DT3*b*. The 3ath dummy transistor DT3*a* may include a 3ath dummy gate electrode DGE3*a*, a 3ath dummy active pattern DACT3*a*, a 3ath dummy source electrode DSE3*a*, and a 3ath dummy drain electrode DDE3*a*. The 3bth dummy transistor DT3*b* may include a 3bth dummy gate electrode DGE3*b*, a 3bth dummy active pattern DACT3*b*, a 3bth dummy source electrode DSE3*b*, and a 3bth dummy drain electrode DDE3*b*. Hereinafter, the 3ath dummy gate electrode DGE3*a* and the 3bth dummy gate electrode DGE3*b* are referred to as a third dummy gate electrode DGE3, the 3ath dummy active pattern DACT3*a* and the 3bth dummy active pattern DACT3*b* are referred to as a third dummy active pattern DACT3, the 3ath dummy source electrode DSE3*a* and the 3bth dummy source electrode DSE3*b* are referred to as the third dummy source electrode DSE3, and the 3ath dummy drain electrode DDE3*a* and the 3bth dummy drain electrode DDE3*b* are referred to as the third dummy drain electrode DDE3.

The third dummy gate electrode DGE3 may be connected to the second second scan line S22. The third dummy gate electrode DGE3 may be provided as a portion of the second second scan line S22 or may be provided in a shape protruding from the second second scan line S22. For example, the 3ath dummy gate electrode DGE3*a* may be provided in a shape protruding from the second second scan line S22, and the 3bth dummy gate electrode DGE3*b* may be provided as a portion of the second second scan line S22.

The third dummy active pattern DACT3, the third dummy source electrode DSE3, and the third dummy drain electrode DDE3 may be formed of a semiconductor layer undoped or doped with impurities. For example, the third dummy source electrode DSE3 and the third dummy drain electrode DDE3 may be formed of a semiconductor layer doped with impurities, and the third dummy active pattern DACT3 may be formed of a semiconductor layer undoped with impurities. The third dummy active pattern DACT3 may correspond to a portion overlapping with the third dummy gate electrode DGE3. One end of the third dummy source electrode DSE3 may be connected to the third dummy active pattern DACT3. The other end of the third dummy source electrode DSE3 may be connected to the first dummy drain electrode DDE1 of the first dummy transistor DT1 and the sixth dummy source electrode DSE6 of the sixth dummy transistor DT6. One end of the third dummy drain electrode DDE3 may be connected to the third dummy active pattern DACT3. The other end of the third dummy drain electrode DDE3 may be connected to the fourth dummy drain electrode DDE4 of the fourth dummy transistor DT4. Also, the third dummy drain electrode DDE3 may be connected to the first dummy gate electrode DGE1 of the first dummy transistor DT1 through the dummy connection line DCNL, the second contact hole CH2, and the first contact hole CH1.

The fourth dummy transistor DT4 may be provided in a double gate structure so as to prevent or substantially reduce a leakage current. That is, the fourth dummy transistor DT4 may include a 4ath dummy transistor DT4*a* and a 4bth dummy transistor DT4*b*. The 4ath dummy transistor DT4*a* may include a 4ath dummy gate electrode DGE4*a*, a 4ath dummy active pattern DACT4*a*, a 4ath dummy source electrode DSE4*a*, and a 4ath dummy drain electrode DDE4*a*, and the 4bth dummy transistor DT4*b* may include a 4bth dummy gate electrode DGE4*a*, a 4bth dummy active pattern DACT4*a*, a 4bth dummy source electrode DSE4*a*, and a 4bth dummy drain electrode DDE4*b*. Hereinafter, the 4ath dummy gate electrode DGE4*a* and the 4bth dummy gate electrode DGE4*b* are referred to as a fourth dummy gate electrode DGE4, the 4ath dummy active pattern DACT4*a* and the 4bth dummy active pattern DACT4*b* are referred to as a fourth dummy active pattern DACT4, the 4ath dummy source electrode DSE4*a* and the 4bth dummy source electrode DSE4*b* are referred to as a fourth dummy source electrode DSE4, and the 4ath dummy drain electrode DDE4*a* and the 4bth dummy drain electrode DDE4*b* are referred to as the fourth dummy drain electrode DDE4.

The fourth dummy gate electrode DGE4 may be connected to a first second scan line S21. The fourth dummy gate electrode DGE4 may be provided as a portion of the first second scan line S21 or may be provided in a shape protruding from the first second scan line S21. For example, the 4ath dummy gate electrode DGE4*a* may be provided as a portion of the first second scan line S21. The 4bth dummy gate electrode DGE4*b* may be provided in a shape protruding from the first second scan line S21.

The fourth dummy active pattern DACT4, the fourth dummy source electrode DSE4, and the fourth dummy drain electrode DDE4 may be formed of a semiconductor layer undoped or doped with impurities. The fourth dummy source electrode DSE4 and the fourth dummy drain electrode DDE4 may be formed of a semiconductor layer doped with impurities, and the fourth dummy active pattern DACT4 may be formed of a semiconductor layer undoped with impurities.

The fourth dummy active pattern DACT4 may correspond to a portion overlapping with the fourth dummy gate electrode DGE4. One end of the fourth dummy source electrode DSE4 may be connected to the fourth dummy active pattern DACT4. The other end of the fourth dummy source electrode DSE4 may be connected to an initialization power line IPL provided on a previous row and a seventh dummy drain electrode DDE7 of a seventh dummy transistor DT7 of a dummy pixel DPXL on the previous row. A dummy auxiliary connection line DAUX may be provided between the fourth dummy source electrode DSE4 and the initialization power line IPL. One end of the dummy auxiliary connection line DAUX may be connected to the fourth dummy source electrode DSE4 through a ninth contact hole CH9. The other end of the dummy auxiliary connection line DAUX may be connected to an initialization power line IPL on the previous row through an eighth contact hole CH8 of the dummy pixel DPXL on the previous row. One end of the fourth dummy drain electrode DDE4 may be connected to the fourth dummy active pattern DACT4, and the other end of the fourth dummy drain electrode DDE4 may be connected to the third dummy drain electrode DDE3 of the third dummy transistor DT3. Also, the fourth dummy drain electrode DDE4 may be connected to the first dummy gate electrode DGE1 of the first dummy transistor DT1 through the dummy connection line DCNL, the second contact hole CH2, and first contact hole CH1.

The fifth dummy transistor DT5 may include a fifth dummy gate electrode DGE5, a fifth dummy active pattern DACT5, a fifth dummy source electrode DSE5, and the fifth dummy drain electrode DDE5.

The fifth dummy gate electrode DGE5 may be connected to a second second emission control line E22. The fifth dummy gate electrode DGE5 may be provided as a portion of the second second emission control line E22 or may be provided in a shape protruding from the second second emission control line E22.

The fifth dummy active pattern DACT5, the fifth dummy source electrode DSE5, and the fifth dummy drain electrode DDE5 may be formed of a semiconductor layer undoped or doped with impurities. For example, the fifth dummy source electrode DSE5 and the fifth dummy drain electrode DDE5 may be formed of a semiconductor layer doped with impurities, and the fifth dummy active pattern DACT5 may be formed of a semiconductor layer undoped with impurities. The fifth dummy active pattern DACT5 may correspond to a portion overlapping with the fifth dummy gate electrode DGE5. One end of the fifth dummy source electrode DSE5 may be connected to the fifth dummy active pattern DACT5. One end of the fifth dummy drain electrode DDE5 may be connected to the fifth dummy active pattern DACT5. The other end of the fifth dummy drain electrode DDE5 may be connected to the first dummy source electrode DSE1 of the first dummy transistor DT1 and the second dummy drain electrode DDE2 of the second dummy transistor DT2.

The sixth dummy transistor DT6 may include a sixth dummy gate electrode DGE6, a sixth dummy active pattern DACT6, the sixth dummy source electrode DSE6, and a sixth dummy drain electrode DDE6.

The sixth dummy gate electrode DGE6 may be connected to the second second emission control line E22. The sixth dummy gate electrode DGE6 may be provided as a portion of the second second emission control line E22 or may be provided in a shape protruding from the second second emission control line E22.

The sixth dummy active pattern DACT6, the sixth dummy source electrode DSE6, and the sixth dummy drain electrode DDE6 may be formed of a semiconductor layer undoped or doped with impurities. For example, the sixth dummy source electrode DSE6 and the sixth dummy drain electrode DDE6 may be formed of a semiconductor layer doped with impurities, and the sixth dummy active pattern DACT6 may be formed of a semiconductor layer undoped with impurities. The sixth dummy active pattern DACT6 may correspond to a portion overlapping with the sixth dummy gate electrode DGE6. One end of the sixth dummy source electrode DSE6 may be connected to the sixth dummy active pattern DACT6. The other end of the sixth dummy source electrode DSE6 may be connected to the first dummy drain electrode DDE1 of the first dummy transistor DT1 and the third dummy source electrode DSE3 of the third dummy transistor DT3. One end of the sixth dummy drain electrode DDE6 may be connected to the sixth dummy active pattern DACT6. The other end of the sixth dummy drain electrode DDE6 may be connected to a seventh dummy source electrode DSE7 of the seventh dummy transistor DT7.

The seventh dummy transistor DT7 may include a seventh dummy gate electrode DGE7, a seventh dummy active pattern DACT7, the seventh dummy source electrode DSE7, and a seventh dummy drain electrode DDE7.

The seventh dummy gate electrode DGE7 may be connected to the second second scan line S22. The seventh dummy gate electrode DGE7 may be provided as a portion of the second second scan line S22 or may be provided in a shape protruding from the second second scan line S22.

The seventh dummy active pattern DACT7, the seventh dummy source electrode DSE7, and the seventh dummy drain electrode DDE7 may be formed of a semiconductor layer undoped or doped with impurities. For example, the seventh dummy source electrode DSE7 and the seventh dummy drain electrode DDE7 may be formed of a semiconductor layer doped with impurities, and the seventh dummy active pattern DACT7 may be formed of a semiconductor layer undoped with impurities.

The seventh dummy active pattern DACT7 may correspond to a portion overlapping with the seventh dummy gate electrode DGE7. One end of the seventh dummy source electrode DSE7 may be connected to the seventh active pattern ACT7. The other end of the seventh dummy source electrode DSE7 may be connected to the sixth dummy drain electrode DDE6 of the sixth dummy transistor DT6. One end of the seventh dummy drain electrode DDE7 may be connected to the seventh dummy active pattern DACT7. The other end of the seventh dummy drain electrode DDE7 may be connected to the initialization power line IPL. Also, the seventh dummy drain electrode DDE7 may be connected to a fourth dummy source electrode DSE4 of a fourth dummy transistor DT4 of a dummy pixel DPXL disposed on a subsequent row. The seventh dummy drain electrode DDE7 and the fourth dummy source electrode DSE4 of the fourth dummy transistor DT4 on the subsequent row may be connected to each other.

The dummy storage capacitor DCst may include a dummy lower electrode DLE and a dummy upper electrode DUE. The dummy lower electrode DLE may be configured as the first dummy gate electrode DGE1 of the first dummy transistor DT1.

When viewed on a plane, the dummy upper electrode DUE overlaps with the first dummy gate electrode DGE1, and may cover the dummy lower electrode DLE. As the overlapping area of the dummy upper electrode DUE and the dummy lower electrode DLE is widened, the capacitance of the dummy storage capacitor DCst may be increased. The dummy upper electrode DUE may extend in the first direction DR1. In an embodiment of the present disclosure, a voltage having the same level as the first power source ELVDD may be applied to the dummy upper electrode DUE. The dummy upper electrode DUE may have an opening OPN in a region including the first contact hole CH1 through which the first dummy gate electrode DGE1 and the dummy connection line DCNL are in contact with each other.

In the dummy pixels DPXL of the fourth dummy part DMP4, the second scan lines S21 to S2$p$ and the second emission control lines E21 to E2$p$ may form a fourth parasitic capacitor by overlapping with the dummy data line DDL, the first to seventh DACT7. For example, one of the second scan lines S21 to S2$p$ and the second emission control lines E21 to E2$p$ may form a (4-1)th fourth parasitic capacitor by overlapping with the first to seventh dummy active patterns DACT1, DACT2, DACT3, DACT4, DACT5, DACT6, and DACT7, and one of the second scan lines S21 to S2$p$ and the second emission control lines E21 to E2$p$ may form a (4-2)th fourth parasitic capacitor by overlapping with the dummy data line DDL. The fourth parasitic capacitance of the fourth parasitic capacitor may increase loads of the second scan lines S21 to S2$p$ and the second emission control lines E21 to E2$p$ of the second display region PXA2. Therefore, the fourth parasitic capacitance may compensate for load values of the second scan lines S21 to S2$p$ and the second emission control lines E21 to E2$p$.

Hereinafter, a structure of the dummy pixel DPXL connected to the second second scan line S22 will be described along a stacking order with reference to FIGS. 17 to 19.

The dummy active patterns DACT1 to DACT7 may be provided on the substrate SUB. The dummy active patterns DACT1 to DACT7 may include the first to seventh dummy active patterns DACT1 to DACT7. The first to seventh dummy active patterns DACT1 to DACT7 may include a semiconductor material.

A buffer layer may be provided between the substrate SUB and the first to seventh dummy active patterns DACT1 to DACT7.

A gate insulating layer GI may be provided on the substrate SUB on which the first to seventh dummy active patterns DACT1 to DACT7 are formed.

The first second scan line S21, the second second scan line S22, the second second emission control line E22, and the first to seventh dummy gate electrodes DGE1 to DGE7 may be provided on the gate insulating layer GI. The first dummy gate electrode DGE1 may become the dummy lower electrode DLE of the dummy storage capacitor DCst. The second dummy gate electrode DGE2 and the third dummy gate electrode DGE3 may be integrally formed with the second second scan line S22. The fourth dummy gate electrode DGE4 may be integrally formed with the first second scan line S21. The fifth dummy gate electrode DGE5 and the sixth dummy gate electrode DGE6 may be integrally formed with the second second emission control line E22. The seventh dummy gate electrode DGE7 may be integrally formed with the second second scan line S22.

A first interlayer insulating layer IL1 may be provided on the substrate SUB on which the first second scan line S21 and the like are formed.

The dummy upper electrode DUE of the dummy storage capacitor DCst and the initialization power line IPL may be provided on the first interlayer insulating layer IL1. The dummy upper electrode DUE along with the dummy lower electrode DLE may constitute the dummy storage capacitor DCst with the first interlayer insulating layer IL1 interposed therebetween. The initialization power line IPL may have a shape extending to the second peripheral region PPA2.

A second interlayer insulating layer IL2 may be provided on the substrate SUB on which the dummy upper electrode DUE and the initialization power line IPL are disposed.

The dummy data line DDL, the dummy connection line DCNL, the dummy auxiliary connection line DAUX, and a first dummy bridge pattern DBRP1 may be provided on the second interlayer insulating layer IL2.

The dummy data line DDL may be connected to the second dummy source electrode DSE2 through the sixth contact hole CH6 passing through the first interlayer insulating layer IL1, the second interlayer insulating layer IL2, and the gate insulating layer GI.

One end of the dummy connection line DCNL may be connected to the first dummy gate electrode DGE1 through the first contact hole CH1 passing through the first interlayer insulating layer IL1 and the second interlayer insulating layer IL2. In addition, the other end of the dummy connection line DCNL may be connected to the third dummy drain electrode DDE3 and the fourth dummy drain electrode DDE4 through the second contact hole CH2 passing through the gate insulating layer GI, the first interlayer insulating layer IL1, and the second interlayer insulating layer IL2.

One end of the dummy auxiliary connection line DAUX may be connected to the fourth dummy source electrode DSE4 and the seventh dummy drain electrode DDE7 of the dummy pixel DPXL on the previous row through the ninth contact hole CH9 passing through the gate insulating layer GI, the first interlayer insulating layer IL1, and the second interlayer insulating layer IL2. In addition, the other end of the dummy auxiliary connection line DAUX may be connected to the initialization power line IPL through the eighth contact hole CH8 passing through the second interlayer insulating layer IL2.

The first dummy bridge pattern DBRP1 may be connected to the sixth dummy drain electrode DDE6 and the seventh dummy source electrode DSE7 through the seventh contact hole CH7 passing through the gate insulating layer GI, the first interlayer insulating layer IL1, and the second interlayer insulating layer IL2.

A third interlayer insulating layer IL3 may be provided on the substrate SUB on which the dummy data line DDL and the like are formed, and a protective layer PSV may be provided on the third interlayer insulating layer IL3.

A pixel defining layer PDL may be provided on the protective layer PSV.

A dummy second electrode DCD may be provided on the pixel defining layer PDL. The dummy second electrode DCD may include the same material as the second electrode CD. The dummy second electrode DCD may be connected to the second electrode CD of the organic light emitting diode OLED. Therefore, the dummy second electrode DCD may be applied with the second power supply line (see "ELVSS" of FIGS. 2 and 3) through the second electrode CD.

An organic layer may be provided between the pixel defining layer PDL and the dummy second electrode DCD. The organic layer may be at least one of the layers constituting the emitting layer EML of the organic light emitting diode OLED of the first pixel PXL1 shown in FIGS. 1 to 7.

For example, the organic layer may include at least one of the HIL, HTL, HBL, ETL, and EIL to be formed as a common layer.

Like the first pixel PXL1, an encapsulation layer SLM may be provided over the dummy second electrode DCD.

As described above, the dummy pixel DPXL may have a structure in which the power line PL, the second bridge pattern BRP2, the first electrode AD, and the emitting layer EML of the first pixel PXL1 shown in FIGS. 1 to 7 are omitted. Therefore, the dummy pixel DPXL cannot emit light. In addition, in the dummy pixel DPXL, the power line PL, the second bridge pattern BRP2, and the first electrode AD are omitted, and hence it is possible to prevent or substantially reduce the incidence of a short circuit between the power line PL and the first electrode AD or a short circuit between the second bridge pattern BRP2 and the first electrode AD.

The fifth dummy part DMP5 may be disposed at the longitudinal part of the third peripheral region PPA3 adjacent to a longitudinal side of the third display region PXA3. For example, in the third peripheral region PPA3, the fifth dummy part DMP5 may be provided between the third display region PXA3 and the first dummy part DMP1 and between the third display region PXA3 and the third dummy part DMP3.

The fifth dummy part DMP5 may be electrically connected to the first dummy part DMP1 and the third dummy part DMP3.

The fifth dummy part DMP5 may have a structure similar or identical to that of the fourth dummy part DMP4. However, the fifth dummy part DMP5 is merely different from the fourth dummy part DMP4 in scan lines and emission control lines, which are connected to the fourth dummy part DMP4. For example, the fifth dummy part DMP5 may be connected to the third scan lines S31 to S3$q$ and the third emission control lines E31 to E3$q$.

In an embodiment of the present disclosure, the second scan lines S2$p$-1 and S2$p$ and the second emission control lines E2$p$-1 and E2$p$ of the first sub-region SA1 may be connected to the first dummy part DMP1 and the fourth dummy part DMP4. Therefore, the first dummy part DMP1 and the fourth dummy part DMP4 may compensate for load values of the second scan lines S2$p$-1 and S2$p$ and the second emission control lines E2$p$-1 and E2$p$ of the first sub-region SA1 by increasing loads of the second scan lines S2$p$-1 and S2$p$ and the second emission control lines E2$p$-1 and E2$p$ of the first sub-region SA1. As a result, the load values of the second scan lines S2$p$-1 and S2$p$ and the second emission control lines E2$p$-1 and E2$p$ of the first sub-region SA1 may be equal or similar to those of the first scan lines S11 to S1$n$ and the first emission control lines E11 to E1$n$ of the first display region PXA1.

In addition, the second scan lines S21 and S22 and the second emission control lines E21 and E22 of the second sub-region SA2 may be connected to the second dummy part DMP2 and the fourth dummy part DMP4. Therefore, the second dummy part DMP2 and the fourth dummy part DMP4 may compensate for load values of the second scan lines S21 and S22 and the second emission control lines E21 and E22 of the second sub-region SA2 by increasing loads of the second scan lines S21 and S22 and the second emission control lines E21 and E22 of the second sub-region SA2. As a result, the load values of the second scan lines S21 and S22 and the second emission control lines E21 and E22 of the second sub-region SA2 may be equal or similar to those of the first scan lines S11 to S1$n$ and the first emission control lines E11 to E1$n$ of the first display region PXA1.

In an embodiment of the present disclosure, the third scan lines S3$q$-1 and S3$q$ and the third emission control lines E3$q$-1 and E3$q$ of the third sub-region SA3 may be connected to the first dummy part DMP1 and the fifth dummy part DMP5. Therefore, the first dummy part DMP1 and the fifth dummy part DMP5 may compensate for load values of the third scan lines S3$q$-1 and S3$q$ and the third emission control lines E3$q$-1 and E3$q$ of the third sub-region SA3 by increasing loads of the third scan lines S3$q$-1 and S3$q$ and the third emission control lines E3$q$-1 and E3$q$ of the third sub-region SA3. As a result, the load values of the third scan lines S3$q$-1 and S3$q$ and the third emission control lines E3$q$-1 and E3$q$ of the third sub-region SA3 may be equal or similar to those of the first scan lines S11 to S1$n$ and the first emission control lines E11 to E1$n$ of the first display region PXA1.

In addition, the third scan lines S31 and S32 and the third emission control lines E31 and E32 of the fourth sub-region SA4 may be connected to the third dummy part DMP3 and the fifth dummy part DMP5. Therefore, the third dummy part DMP3 and the fifth dummy part DMP5 may compensate for load values of the third scan lines S31 and S32 and the third emission control lines E31 and E32 of the fourth sub-region SA4 by increasing loads of the third scan lines S31 and S32 and the third emission control lines E31 and E32 of the fourth sub-region SA4. As a result, the load values of the third scan lines S31 and S32 and the third emission control lines E31 and E32 of the fourth sub-region SA4 may be equal or similar to those of the first scan lines S11 to S1$n$ and the first emission control lines E11 to E1$n$ of the first display region PXA1.

As described above, the display device has two or more regions having different areas, and luminance in each region can be uniform.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements or features described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Example embodiments have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various suitable changes in form and details may be made without departing from the spirit and scope of the present disclosure as defined by the following claims and equivalents thereof.

What is claimed is:

1. A display device, comprising:
a substrate comprising a first display region, and second and third display regions extending from the first display region;
first pixels in the first display region and first lines electrically connected to the first pixels;
second pixels in the second display region and second lines electrically connected to the second pixels;
third pixels in the third display region and third lines electrically connected to the third pixels; and
a first dummy part located between the second pixels and the third pixels,
wherein the first dummy part is electrically connected to a portion of the second lines and a portion of the third lines.

2. The display device of claim 1, wherein:
the first lines are longer than the second and third lines, and
the first dummy part is configured to compensate for a difference between a load value of the first lines and a load value of the portion of each of the second and third lines.

3. The display device of claim 2, wherein:
the second display region comprises a first sub-region adjacent to the first display region and a second sub-region adjacent to the first sub-region,
the third display region comprises a third sub-region adjacent to the first display region and a fourth sub-region adjacent to the third sub-region, and
the first dummy part is electrically connected to the second lines of the first sub-region and the third lines of the third sub-region and is configured to compensate for a first load value.

4. The display device of claim 3, further comprising line connection parts connecting the second lines of the first sub-region and the third lines of the third sub-region, wherein the line connection parts overlap with the first dummy part.

5. The display device of claim 3, wherein:
the substrate further comprises a non-display region, the non-display region comprising a first non-display region adjacent to the first display region, a second non-display region adjacent to the second display region, a third non-display region adjacent to the third display region, and an additional non-display region located between the second non-display region and the third non-display region, and
the first dummy part is in the additional non-display region.

6. The display device of claim 5, wherein:
each of the first pixels, the second pixels, and the third pixels comprises at least one transistor connected to a corresponding data line from among data lines and a corresponding one of the first to third lines and a light emitting element electrically connected to the at least one transistor, and
the at least one transistor comprises:
an active pattern on the substrate;
a source electrode and a drain electrode, each of the source and drain electrodes being connected to the active pattern;
a gate electrode on the active pattern with a gate insulating layer interposes therebetween; and
an interlayer insulating layer covering the gate electrode, the interlayer insulating layer comprising a first interlayer insulating layer, a second interlayer insulating layer, and a third interlayer insulating layer that are sequentially stacked.

7. The display device of claim 6, further comprising:
a power supply line on the second interlayer insulating layer in the non-display region, the power supply line overlapping with line connection parts in the additional non-display region,
wherein a line connection part from among the line connection parts is between the first interlayer insulating layer and the second interlayer insulating layer.

8. The display device of claim 7, wherein:
the first dummy part comprises a first parasitic capacitor formed by the line connection parts and the power supply line, and
the first dummy part further comprises a first dummy pattern connected to the power supply line through a contact opening, the first dummy pattern being between the substrate and the gate insulating layer.

9. The display device of claim 8, further comprising:
a second dummy part electrically connected to an end portion of the second lines and configured to compensate for a second load value, and
a third dummy part electrically connected to an end portion of the third lines and configured to compensate for a third load value,
wherein:
the second dummy part is in the second non-display region corresponding to the second sub-region, and
the third dummy part is in the third non-display region corresponding to the fourth sub-region.

10. The display device of claim 9, wherein:
the second dummy part and the third dummy part comprise first dummy lines and second dummy lines that overlap with the power supply line and are connected to the second lines and the third lines, and
the first dummy lines and the second dummy lines are between the first interlayer insulating layer and the second interlayer insulating layer.

11. The display device of claim 10, wherein each of the second dummy part and the third dummy part comprises a second parasitic capacitor formed by the first and second dummy lines and the power supply line.

12. The display device of claim 11, wherein each of the second dummy part and the third dummy part further comprises second and third dummy patterns that are connected to the power supply line through a dummy contact opening, and are between the substrate and the gate insulating layer.

13. The display device of claim 9, further comprising:
a fourth dummy part electrically connected to the first dummy part and the second dummy part in the second non-display region; and
a fifth dummy part electrically connected to the first dummy part and the third dummy part in the third non-display region.

14. The display device of claim 13, wherein:
each of the fourth dummy part and the fifth dummy part comprises at least one dummy pixel,
the at least one dummy pixel comprises:
at least one dummy transistor electrically connected to a corresponding data line from among the data lines and a corresponding one of the second lines and third lines;
a protective layer on the at least one dummy transistor;
a pixel defining layer on the protective layer; and
a dummy electrode on the pixel defining layer, and
the dummy electrode comprises a same material as a portion of the light emitting element.

15. The display device of claim 14, wherein each of the fourth dummy part and the fifth dummy part comprises a third parasitic capacitor, the third parasitic capacitor comprising a first third parasitic capacitor formed by one of the second lines and the third lines and an active pattern of the at least one dummy transistor, and a second third parasitic capacitor formed by one of the second lines and the third lines and the corresponding data line.

16. The display device of claim 14, wherein:
the at least one dummy pixel of the fourth dummy part is electrically connected to the second lines and first dummy lines of the second dummy part, and
the at least one dummy pixel of the fifth dummy part is electrically connected to the third lines and first dummy lines of the third dummy part.

17. The display device of claim 3, wherein:
each of the second display region and the third display region has an area smaller than an area of the first display region, and
each of the second sub-region and the fourth sub-region has a shape with a decreasing width further away from the first display region.

18. A display device, comprising:
a substrate comprising a first display region, and second and third display regions extending from the first display region;
first pixels in the first display region and first lines electrically connected to the first pixels;
second pixels in the second display region and second lines electrically connected to the second pixels;
third pixels in the third display region and third lines electrically connected to the third pixels;
a first dummy part electrically connected to an end portion of the second lines; and a second dummy part electrically connected to an end portion of the third lines, wherein the first dummy part is electrically connected to a portion of the second pixels, and wherein the second dummy part is electrically connected to a portion of the third pixels.

19. The display device of claim 18, wherein:

the substrate further comprises a non-display region, the non-display region comprising a first non-display region adjacent to the first display region, a second non-display region adjacent to the second display region, a third non-display region adjacent to the third display region, and an additional non-display region located between the second non-display region and the third non-display region, the first dummy part is in the second non-display region and is configured to compensate for a first load value, and the second dummy part is in the third non-display region and is configured to compensate for a second load value.

20. The display device of claim 19, wherein:

the second display region comprises a first sub-region adjacent to the first display region and a second sub-region adjacent to the first sub-region, the third display region comprises a third sub-region adjacent to the first display region and a fourth sub-region adjacent to the third sub-region, and a third dummy part is in the additional non-display region, is electrically connected to the second lines of the first sub-region and the third lines of the third sub-region, and is configured to compensate for a third load value.

* * * * *